(12) United States Patent  (10) Patent No.: US 7,442,989 B2
Kobayashi et al.  (45) Date of Patent: Oct. 28, 2008

(54) NONVOLATILE SEMICONDUCTOR MEMORY DEVICE AND METHOD OF MANUFACTURING THEREOF

(75) Inventors: Takashi Kobayashi, Tokorozawa (JP); Toshiyuki Mine, Fussa (JP)

(73) Assignee: Renesas Technology Corp., Tokyo (JP)

( * ) Notice: Subject to any disclaimer, the term of this patent is extended or adjusted under 35 U.S.C. 154(b) by 427 days.

(21) Appl. No.: 10/721,874

(22) Filed: Nov. 26, 2003

(65) Prior Publication Data

US 2004/0104425 A1  Jun. 3, 2004

(30) Foreign Application Priority Data

Nov. 27, 2002  (JP) .......................... P2002-343742

(51) Int. Cl.
*H01L 29/40* (2006.01)

(52) U.S. Cl. ...................................... 257/325; 257/320

(58) Field of Classification Search .................. 257/36, 257/321, 390, 314, 315, 320, 377, 380, 389, 257/391, 322, 324, 325, 323

See application file for complete search history.

(56) References Cited

U.S. PATENT DOCUMENTS

| | | | | |
|---|---|---|---|---|
| 5,060,034 A * | 10/1991 | Shimizu et al. | ............. | 257/314 |
| 5,319,230 A * | 6/1994 | Nakao | .......................... | 257/325 |
| 5,408,115 A * | 4/1995 | Chang | ........................ | 257/324 |
| 5,966,603 A | 10/1999 | Eitan | ........................... | 438/258 |
| 6,011,725 A * | 1/2000 | Eitan | ...................... | 365/185.33 |
| 6,218,700 B1 * | 4/2001 | Papadas | ....................... | 257/324 |
| 6,410,412 B1 * | 6/2002 | Taira et al. | ................... | 438/594 |
| 6,680,505 B2 * | 1/2004 | Ohba et al. | ................. | 257/314 |
| 6,834,013 B2 * | 12/2004 | Fan et al. | ................ | 365/185.29 |
| 6,867,455 B2 * | 3/2005 | Itoh et al. | .................... | 257/330 |
| 2002/0140023 A1 * | 10/2002 | Ohba et al. | .................. | 257/315 |

FOREIGN PATENT DOCUMENTS

JP  5-75133  3/1993

\* cited by examiner

*Primary Examiner*—Thomas L Dickey
(74) *Attorney, Agent, or Firm*—Miles & Stockbridge P.C.

(57) ABSTRACT

This invention is intended to improve reliability of a nonvolatile semiconductor memory device and reduces a memory cell size of the nonvolatile semiconductor memory device. A memory cell which includes source/drain diffusion layers in a p-type well formed in a silicon substrate, silicon nitride dots which are located between silicon oxide films and into which charges are injected, a control gate 212, and assist gates is formed. Programming is conducted to the memory cell by injecting electrons into the drain-side silicon nitride dots or the source-side silicon nitride dots. Since silicon nitride serving as a charge injected section is in the form of dots, it is possible to suppress movement of the charges in a channel direction, to prevent the charges on a source end portion and those on a drain end portion from being mixed together, and to improve charge holding characteristic of the memory cell. Even in the case where a gate length is shortened, the charge holding characteristic can be secured.

20 Claims, 46 Drawing Sheets

PROGRAM 1

PROGRAM 2

READ 1

READ 2

PROGRAM

READ

PROGRAM 1

READ 1

PROGRAM 2

READ 2

PROGRAM 1

READ 1

PROGRAM 2

READ 2

PROGRAM 1

PROGRAM 2

READ 1

READ 2

NONVOLATILE SEMICONDUCTOR MEMORY DEVICE AND METHOD OF MANUFACTURING THEREOF

TECHNICAL FIELD OF THE INVENTION

This invention relates to a nonvolatile semiconductor memory device and a method of manufacturing the nonvolatile semiconductor memory device. More specifically, this invention relates to a method of realizing improved integration and reliability of the nonvolatile semiconductor memory device.

BACKGROUND OF THE INVENTION

Nonvolatile semiconductor memory devices represented by flash memories are excellent in mobility and impact resistance and electrically bulk-erasable. Therefore, demand for the nonvolatile semiconductor memory devices as files of small-sized mobile information equipment such as a mobile personal computer, a digital still camera, and a digital video camera suddenly expand.

To expand the market of the nonvolatile semiconductor memory devices, it is essential to reduce cost by reducing an area of memory cells per bit. To this end, various techniques for storing data of two bits in one memory cell have been proposed.

Among these techniques, there is known one for injecting charges into discrete traps in a silicon nitride film, as disclosed in, for example, Patent Documents 1 (U.S. Pat. No. 6,011,725) and 2 (U.S. Pat. No. 5,966,603).

As shown in, for example, FIG. 85, a memory cell of this type comprises a p-type well 102 in a silicon substrate 101, source/drain diffusion layers 103 and 103' in the well 102, a silicon nitride film 111 which is a charge injected film, a control gate 109, a silicon oxide film 105 which isolates the p-type well 102 from the silicon nitride film 111, and a silicon oxide film 108 which isolates the control gate 109 from the silicon nitride film 111. The control gates 109 of respective memory cells are connected to one another in a row direction to constitute word lines, respectively. The source/drain diffusion layers 103 and 103' are shared between adjacent memory cells. Reference numeral 104 denotes an isolation region.

The memory cell stated above has a silicon oxide film (SiO$_2$)/silicon nitride film (SiN)/silicon oxide film (SiO$_2$) or so-called ONO film serving as a gate insulator film of a MOS (Metal Oxide Semiconductor) transistor. Therefore, the semiconductor memory device including these memory cells is referred to as "MONOS nonvolatile semiconductor memory device".

According to the Patent Documents 1 and 2, channel hot electron injection is conducted for programming so as to store two bits in one memory cell, and electrons are injected into traps in the silicon nitride film 111 on both end portions of the sources 103 and 103' according to voltage bias conditions.

First, to inject electrons into the silicon nitride film 111 on the end portion of the source 103', independent positive voltages are biased to the word line (control gate) 109 and the drain 103', respectively and voltages of the p-type well 102 and the source 103 are set at 0V, as shown in FIG. 86. As a result, hot electrons are generated in a channel on the end portion of the drain 103', and the electrons are injected into the silicon nitride film 111 (a portion A in FIG. 86) on the end portion of the drain 103'.

Next, to inject electrons into the silicon nitride film 111 (a portion B in FIG. 87) on an end portion of the source 103, independent positive voltages are biased to the word line 109 and the source 103, respectively and voltages of the p-type well 102 and the drain 103' are set at 0V, as shown in FIG. 87.

During reading, the source/drain diffusion layers 103 and 103' are biased oppositely to those during programming so as to detect the injected electrons with high sensitivity, as shown in FIGS. 88 and 89.

As will be described later, a nonvolatile semiconductor memory device that secures a quantity of captured charges is disclosed in, for example, Patent Document 3 (Japanese Patent Application Laid-open No. 5-75133).

SUMMARY OF THE INVENTION

The above-mentioned nonvolatile semiconductor memory devices have the following disadvantages in terms of reliability and reduction of memory cell size.

First, in the above-mentioned nonvolatile semiconductor memory device, electrons are locally injected into a certain part of each of traps discretely present in the silicon nitride film. According to our study, a barrier height of the silicon nitride film that isolates the traps from one another is smaller than a height of the silicon oxide film. Due to this, if the device is turned off and left, the electrons that have been injected into the upper portion of the source or the drain move in a channel direction, with the result that a threshold voltage lowers, i.e., the charge holding characteristic of the memory cell is deteriorated (retention degradation occurs).

Furthermore, if a channel length is shortened as the memory cell size is reduced, the electrons that have been injected into the upper portion of the source or drain move toward the other opposite source or drain. This disadvantageously makes it impossible to discriminate the information of two bits generated.

As can be seen, the development of a novel nonvolatile semiconductor memory device and a manufacturing method therefor have been desired so as to solve the problems related to an improvement of the reliability of the MONOS nonvolatile semiconductor memory device and a reduction of a memory cell size thereof.

It is an object of this invention to improve the reliability of a nonvolatile semiconductor memory device.

It is another object of this invention to reduce a memory cell size of a nonvolatile semiconductor memory device.

These and other objects of this invention as well as novel features thereof will be apparent from the reading of this specification and accompanying drawings.

Outlines of typical inventions among those disclosed in this application will be described briefly as follows.

The nonvolatile semiconductor memory device according to the present invention comprises (a) a first insulator film formed above a semiconductor substrate; (b) silicon nitride dots formed on the first insulator film; (c) a second insulator film formed on the silicon nitride dots; (d) a conductive film formed on the second insulator film; (e) first and second semiconductor regions formed in the semiconductor substrate; (f) a channel region located between the first and second semiconductor regions, wherein (g) programming is performed by injecting charges from the channel region into the silicon nitride dots on a first end portion of the channel region on a side of the first semiconductor region or into the silicon nitride dots on a second end portion of the channel region on a side of the second semiconductor region.

The method of manufacturing a nonvolatile semiconductor memory device according to the present invention comprises the steps of: (a) forming first and second semiconductor regions in a semiconductor substrate; (b) forming a first insulator film on the first and second semiconductor regions; (c)

precipitating silicon dots on the first insulator film; (d) forming silicon nitride dots by nitriding the silicon dots; (e) forming a second insulator film on the silicon nitride dots; and (f) forming a conductive film on the second insulator film.

BRIEF DESCRIPTIONS OF THE DRAWINGS

DESCRIPTION OF THE PREFERRED EMBODIMENTS

Figure 1:
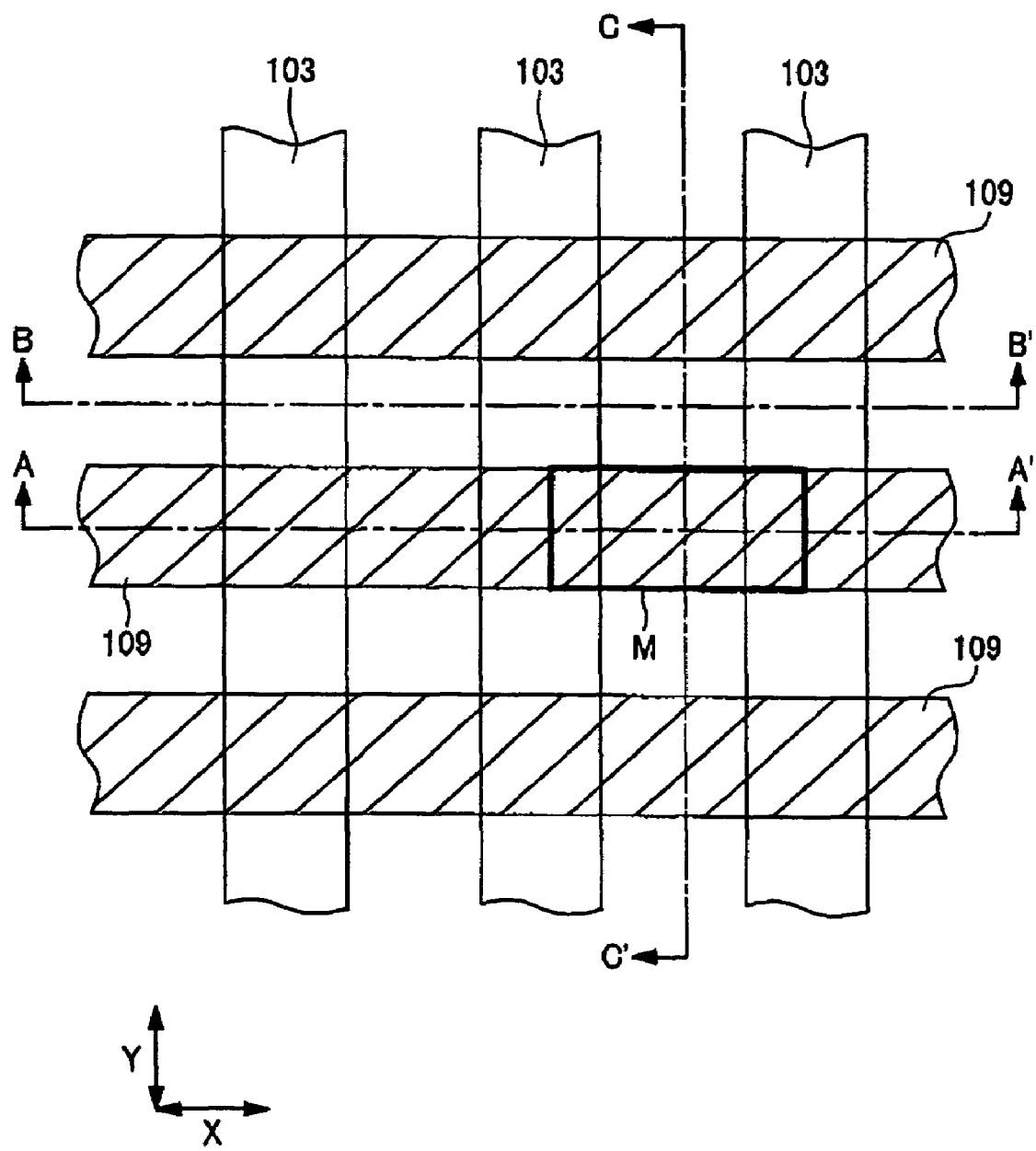
FIG. 1 is a plan view which illustrates important parts of a memory cell in a nonvolatile semiconductor memory device in the first embodiment of this invention.

Embodiments of this invention will be described hereinafter in detail with reference to the drawings. In all figures used to describe the embodiments, constituent elements having the same functions are denoted by the same reference numerals, respectively and will not be repeatedly described.

First Embodiment

Figure 2:
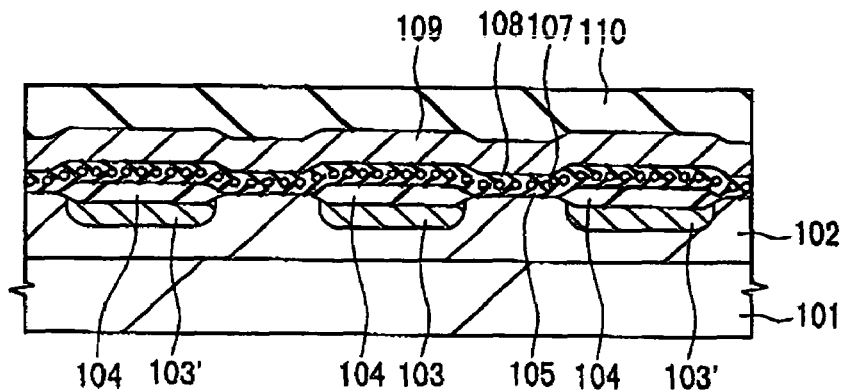
FIG. 2 is a cross-sectional view which illustrates important parts of the memory cell in the nonvolatile semiconductor memory device in the first embodiment of this invention.
Figure 3:
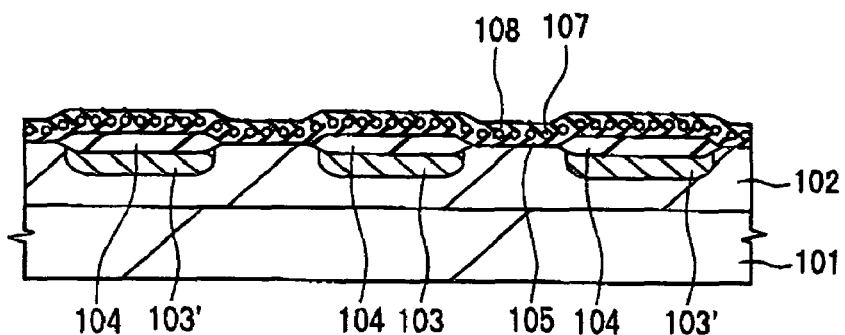
FIG. 3 is a cross-sectional view which illustrates important parts of the memory cell in the nonvolatile semiconductor memory device in the first embodiment of this invention.
Figure 4:
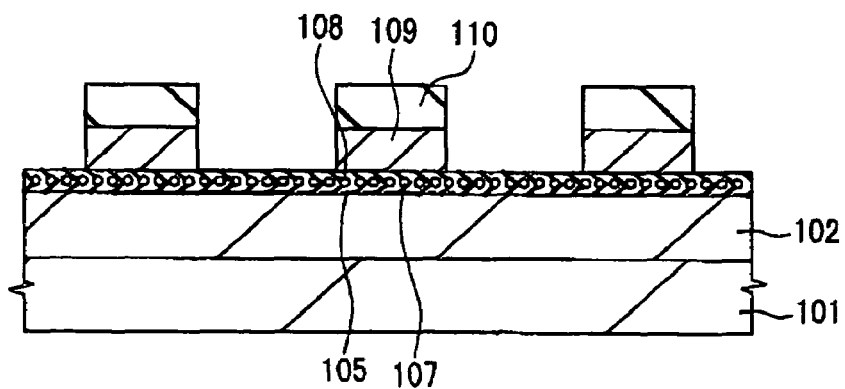
FIG. 4 is a cross-sectional view which illustrates important parts of the memory cell in the nonvolatile semiconductor memory device in the first embodiment of this invention.

The first embodiment of this invention will be described with reference to FIGS. 1 to 16. FIG. 1 is a plan view of a memory cell array in which memory cells of a nonvolatile semiconductor memory device in this embodiment are arranged in a matrix. FIG. 2 is a cross sectional view taken along line A-A' of FIG. 1. FIG. 3 is a cross sectional view taken along line B-B' of FIG. 1. FIG. 4 is a cross sectional view taken along line C-C' of FIG. 1. FIGS. 5 to 8 are cross-sectional views which illustrate program and read operation conditions of the memory cell. FIGS. 9 to 16 are cross-sectional views which illustrate important parts of a substrate and which illustrate a memory cell manufacturing process.

As shown in FIGS. 1 to 4, the memory cell in this embodiment comprises n-type (second conductive type) source/drain diffusion layers (semiconductor regions) 103 and 103' in a p-type (first conductive type) well 102 formed in a silicon substrate 101, silicon nitride (SiN) dots 107 into which charges are injected, and a control gate 109.

The control gates of respective memory cells are connected to one another in the row direction (X direction) and constitute word lines, respectively.

A silicon oxide film 105 serving as a first insulator film isolates the silicon nitride dots 107 from the p-type well 102. A silicon oxide film 108 serving as a second insulator film isolates the silicon nitride dots 107 from the oxide gate 109. The silicon oxide film 108 also functions to isolate the silicon nitride dots 107 from one another.

The source/drain diffusion layers 103 and 103' are arranged perpendicularly to the word line 109 (in a Y direction), and present as a local source line and a local data line that connect sources and drains of memory cells in a column direction. Namely, the nonvolatile semiconductor memory device in this embodiment comprises a so-called contactless array per memory cell. A channel is formed in a perpendicular direction to the diffusion layers 103 and 103'. In FIG. 1, reference numeral M denotes a memory cell region.

The large difference of the nonvolatile semiconductor memory device in this embodiment from that described above with reference to FIGS. 85 to 89 is that silicon nitride into which charges are injected is dot-shaped in the order of nanometers while silicon nitride in the prior art is a continuous film. While a plurality of electron traps are present in one nitride dot, the nitride dots are isolated from one another by the silicon oxide film having a large barrier height. As a result, the movement of charges in the channel direction is suppressed while the device is left, thereby improving the charge holding characteristic of the memory cell.

A "dot" means herein a granular lump mainly containing silicon nitride. A "dot film" means herein a discontinuous film on which a plurality of these dots are arranged on a plane. Each dot is isolated from the other dots in units of granular lumps and covered with a film, e.g., the silicon oxide film, having a larger barrier height than that of the main component of the dot. Due to this, even if the dot film is discontinuous, many holes are formed therein. If a film in which charges are movable through outer peripheries of holes is employed, the effect of the film is lower. If a plurality of dots are stacked, it is difficult to isolate dots on an upper layer from those on a lower layer, which tends to generate a route on which charges move. If the dots are stacked and isolated from one another by the other insulator film, a thickness of the insulator film including the dots increases, making it difficult to reduce a memory cell size. It is, therefore, preferable that the dot film is a film on which single layer dots (in a line) are spread on a plane.

Program and read operations of the memory cell in this embodiment will be described with reference to FIGS. 5 to 8.

A method of storing two bits in one memory cell is almost equal to the method for the nonvolatile semiconductor memory device described above with reference to FIGS. 85 to 89.

Figure 5:
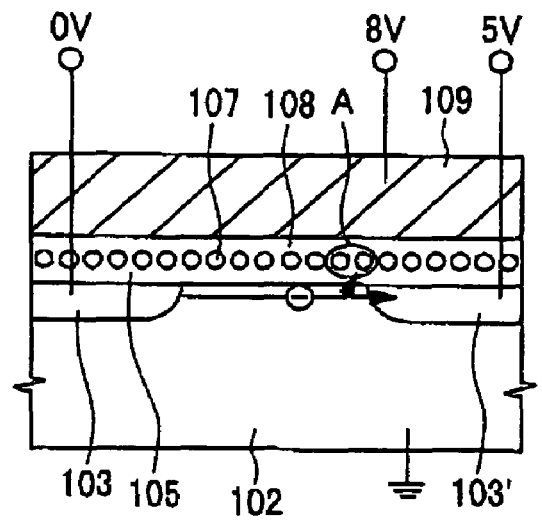
FIG. 5 is a cross-sectional view for describing operations of the nonvolatile semiconductor memory device in the first embodiment of this invention.

First, to inject electrons into the silicon nitride dots on the end portion of the drain 103', independent positive voltages are biased to the word line 109 and the drain 103', respectively and voltages of the p-type well 102 and the source 103 are set at 0V, as shown in FIG. 5. As a result, hot electrons are generated in a channel on the end portion of the drain 103', and the electrons are injected into the silicon nitride dots 107 (a portion A in FIG. 5) on the end portion thereof.

Figure 6:
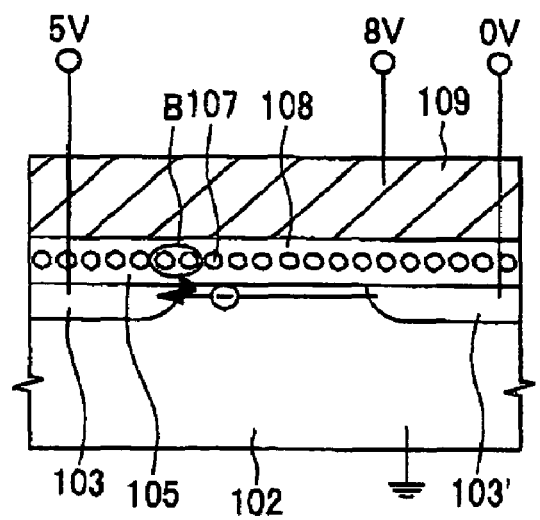
FIG. 6 is a cross-sectional view for describing operations of the nonvolatile semiconductor memory device in the first embodiment of this invention.

Next, to inject electrons into the silicon nitride dots on the end portion of the source 103, independent positive voltages are biased to the word line 109 and the source 103, respectively, voltages of the p-type well 102 and the drain 103' are set at 0V, and electrons are injected into a portion B, as shown in FIG. 6.

Figure 7:
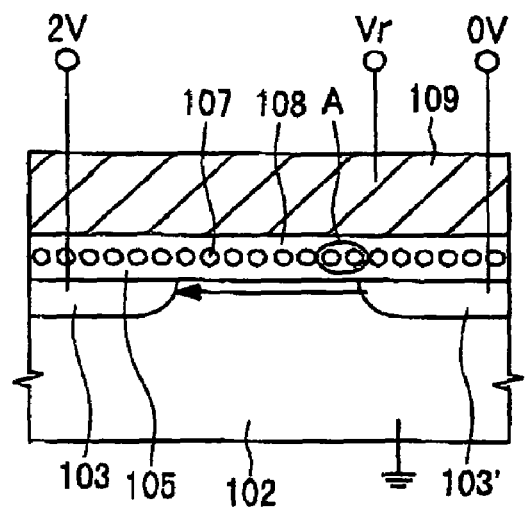
FIG. 7 is a cross-sectional view for describing operations of the nonvolatile semiconductor memory device in the first embodiment of this invention.
Figure 8:
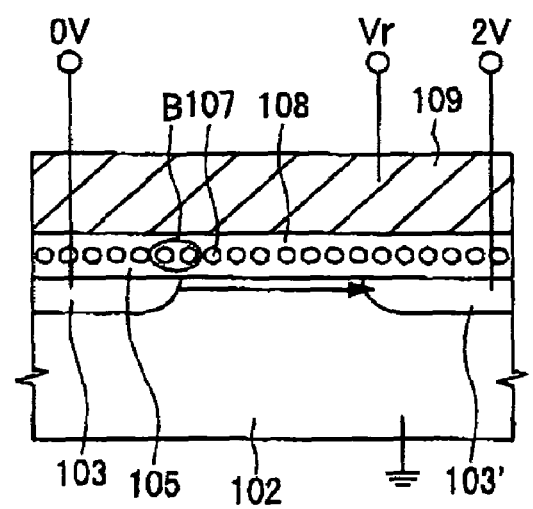
FIG. 8 is a cross-sectional view for describing operations of the nonvolatile semiconductor memory device in the first embodiment of this invention.

In a read operation, as shown in FIGS. 7 and 8, the source/drain diffusion layers 103 and 103' are oppositely biased to those in the program operation so as to detect the injected electrons with high sensitivity. Symbol Vr denotes a read voltage.

In an erase operation, when the electrons are injected into the portion A shown in FIG. 5, then a positive voltage and a negative voltage are biased to the drain 103' and the word line 109, respectively, for example, voltages of the p-type well 102 and the source 103 are set at 0V, and holes generated in the end portion of the drain are injected into the portion A. If the electrons are injected into the portion B as shown in FIG. 6, then a positive voltage and a negative voltage are biased to the source 103 and the word line 109, respectively, for example, voltages of the p-type well 102 and the drain 103' are set at 0V, and holes generated in the end portion of the source are injected into the portion B.

A method of manufacturing the memory cell in this embodiment will next be described with reference to FIGS. 9 to 16.

Figure 9:
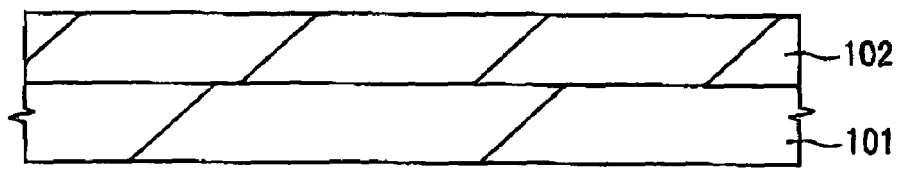
FIG. 9 is a cross-sectional view for describing a method of manufacturing the nonvolatile semiconductor memory device in the first embodiment of this invention.
Figure 10:
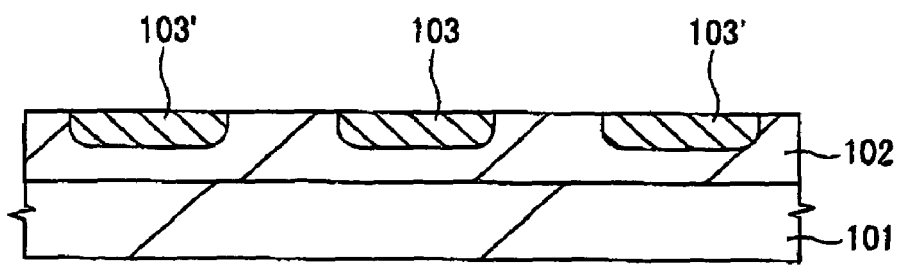
FIG. 10 is a cross-sectional view for describing a method of manufacturing the nonvolatile semiconductor memory device in the first embodiment of this invention.
Figure 11:
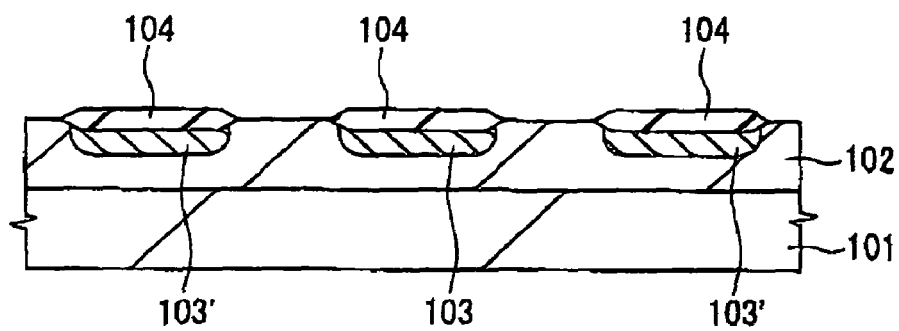
FIG. 11 is a cross-sectional view for describing a method of manufacturing the nonvolatile semiconductor memory device in the first embodiment of this invention.
Figure 12:
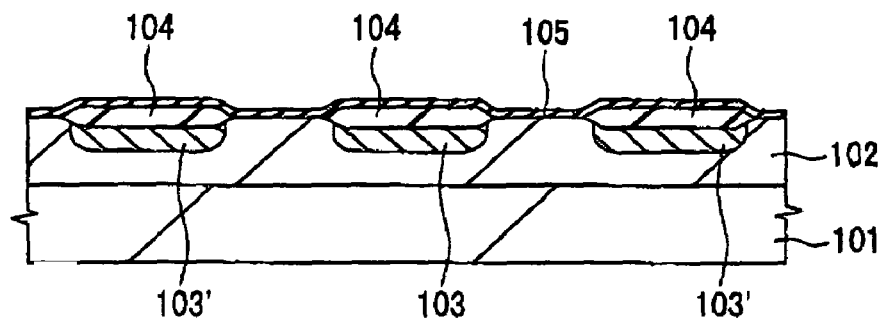
FIG. 12 is a cross-sectional view for describing a method of manufacturing the nonvolatile semiconductor memory device in the first embodiment of this invention.
Figure 13:
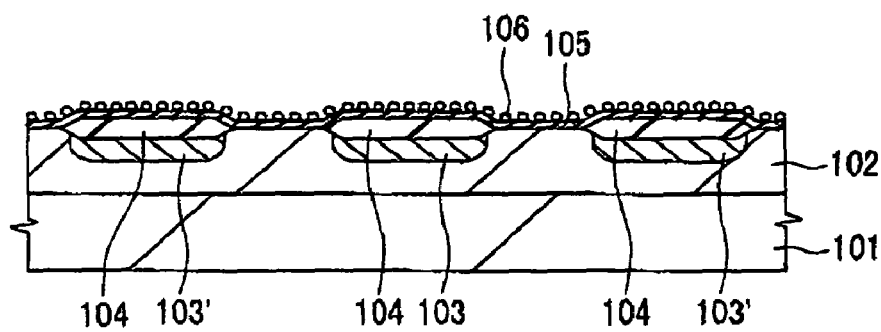
FIG. 13 is a cross-sectional view for describing a method of manufacturing the nonvolatile semiconductor memory device in the first embodiment of this invention.

First, the p-type well 102 is formed on the p-type silicon (Si) substrate 101 having a surface orientation (100) by ion implantation (FIG. 9). The diffusion layer regions 103 and 103' serving as the source and drain of the memory cell are formed by the implantation of n-type impurities such as arsenic ions (FIG. 10). Next, the diffusion layer regions 103 ad 103' are selectively oxidized by a thermal oxidation method to thereby form isolation regions 104 each comprising the silicon oxide film (FIG. 11). The silicon oxide film 105 serving as the first insulator film for isolating the silicon nitride dots from the well is formed by the thermal oxidation method (FIG. 12). Silicon nano-dots 106 of a diameter of about 10 nm are formed by a low pressure chemical vapor deposition (hereinafter, "LPCVD") method (FIG. 13). By subjecting Si to chemical vapor deposition under conditions of, for example, a temperature of 550 to 650° C. (preferably 580 to 640° C., more preferably 600 to 610° C.), a material gas flow rate of 10 to 100 sccm (preferably 40 to 60 sccm), and a pressure of 10 to 100 Pa (preferably 20 to 30 Pa), the silicon nano-dots 106 of a diameter of, for example, about 10 nm can be formed substantially on a single layer. The dots are each set to have a diameter equal to or smaller than 30 nm and grown to the extent that the dots are not connected to one another. By the deposition under these conditions, it is possible to form not the continuous film but the dot film stably.

Figure 14:
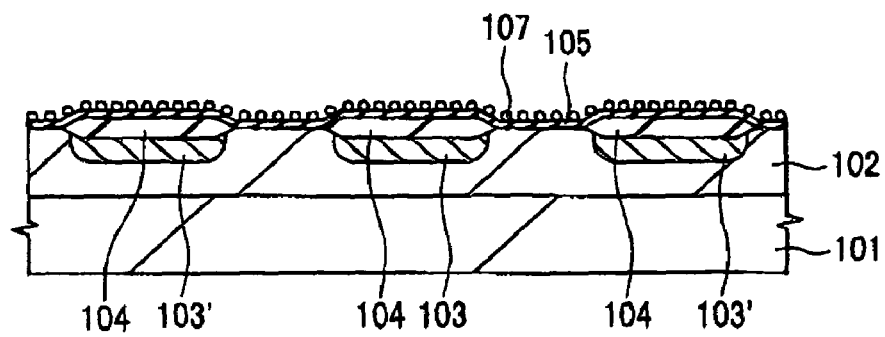
FIG. 14 is a cross-sectional view for describing a method of manufacturing the nonvolatile semiconductor memory device in the first embodiment of this invention.

The silicon nano-dots 106 are then subjected to plasma nitriding (the silicon nano-dots 106 are nitrided in a plasma atmosphere) to provide the silicon nitride dots 107 (FIG. 14). Each silicon nitride dot 107 formed by this method has a structure of $Si_xN_{1-x}$ (0<X<1) and a composition ratio X of silicon (Si) to nitrogen (N) is approximately 0.43 (X=0.43). Since a plasma nitriding reaction conducted to the silicon dots progresses toward a dot central portion rather than a dot surface, a nitrogen concentration of the dot surface is higher than that of the dot central portion.

As a material gas for plasma nitriding, ammonia ($NH_3$) or nitrogen ($N_2$) is employed. Plasma nitriding treatment conditions are, for example, a temperature of 200 to 600° C. (preferably 400 to 500° C.), a material gas flow rate is 50 to 100 sccm, and a pressure of 10 to 700 Pa (preferably 40 to 80 Pa). Thus, plasma nitriding can be conducted under these conditions in a plasma atmosphere. Further, by performing nitriding in the plasma atmosphere, silicon nano-dots can be transformed to silicon nitride dots at lower temperature than that for, for example, thermal nitriding.

To form the silicon nitride dots, a formation method including directly depositing, for example, dichlorosilane or monosilane and ammonia used as material gases by an LPCVD Method may be considered. With this method, however, silicon nitride tends to be formed into a continuous film and it is difficult to stably form dots.

Alternatively, silicon oxide nitride dots may be employed as a charge trap layer. The silicon oxide nitride dots can be formed by, for example, oxidizing silicon nano-dots and subjecting the resultant oxidized silicon nano-dots to plasma nitriding or by subjecting the silicon nano-dots to a plasma treatment in an oxygen-containing nitrogen atmosphere. Since a barrier height difference between the silicon nitride film and the silicon oxide film is larger than that between the silicon oxide nitride film and the silicon oxide film. Therefore, the use of the silicon nitride dots as the charge trap layer can ensure a greater effect of preventing the movement of charges than the use of the silicon oxide nitride dots.

Furthermore, it may be possible to employ conductive dots such as silicon dots as the charge trap layer. In this case, however, operation voltage increases because capacity coupling occurs between the dots and each of the upper and lower insulator films. Therefore, the use of the insulating dots can ensure making a driving voltage lower than the use of the conductive dots.

Figure 15:
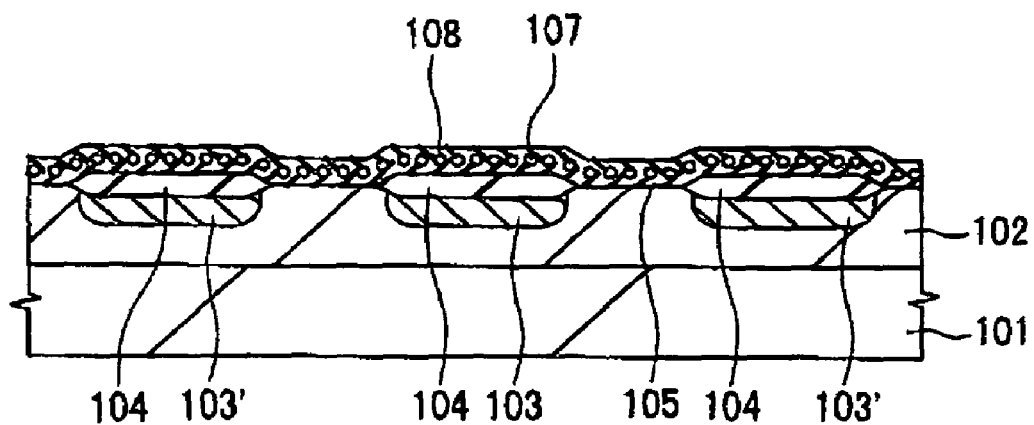
FIG. 15 is a cross-sectional view for describing a method of manufacturing the nonvolatile semiconductor memory device in the first embodiment of this invention.

Next, after forming the silicon nitride dots, the silicon oxide film 108 serving as the second insulator film for isolating the dots from the control gate is formed by the LPCVD method (FIG. 15).

By completely isolating the silicon nitride dots using the silicon oxide films, i.e., first and second insulator films, the electrons injected into the silicon nitride dots are easily moved between the traps that are present in one dot; however, a high energy is required to move the electrons between the dots. This is because the silicon oxide film is larger in barrier height than the silicon nitride film. By thus providing a structure in which the silicon nitride dots are buried in the silicon oxide film, it is possible to suppress the movement of the electrons injected into the dots, in the channel direction.

Japanese Patent Application Laid-open No. 5-75133, for example, describes a method of nitriding silicon precipitated in a silicon-rich silicon oxide film and injecting electrons into silicon nitride. However, this method is considered to have the following disadvantages. The silicon-rich silicon oxide film ($Si_xO_2$, (X>1)) has many traps therein and it is difficult to secure the charge holding characteristic of the memory cell. In addition, it is difficult to provide single layer traps and secure insulation between the stacked traps. Further, since the thickness of the traps and those of the insulator films located above and below the traps tend to be large, it is difficult to deal with the reduction of a memory cell size. It is considered that the silicon oxide film that covers the silicon nitride dots in this embodiment is $Si_xO_2$, where X≦1.

Figure 16:
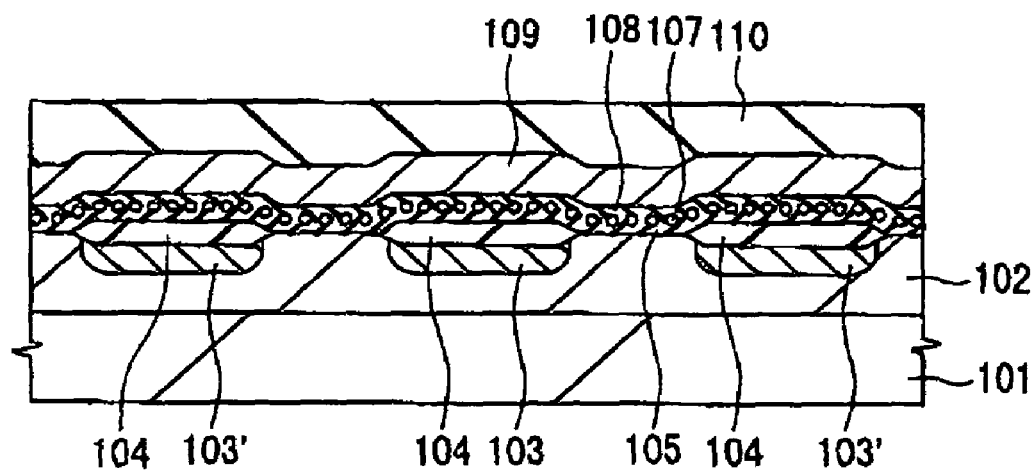
FIG. 16 is a cross-sectional view for describing a method of manufacturing the nonvolatile semiconductor memory device in the first embodiment of this invention.

Thereafter, a conductive film serving as the control gate, e.g., a polysilicon-tungsten silicide stacked film or so-called polycide film 109 and a silicon oxide film 110 are deposited and patterned by well-known lithographic and dry etching techniques, thereby forming a word line (FIG. 16). Although not shown in the drawings, after an interpoly dielectric film is deposited, contact holes leading to the word line 109, the source/drain diffusion layers 103 and 103', and the p-type well 102 are formed in this interpoly dielectric film. A metal film is then deposited and patterned to form a metal wire. The memory cell of the nonvolatile semiconductor memory device is thus completed.

Figure 17:
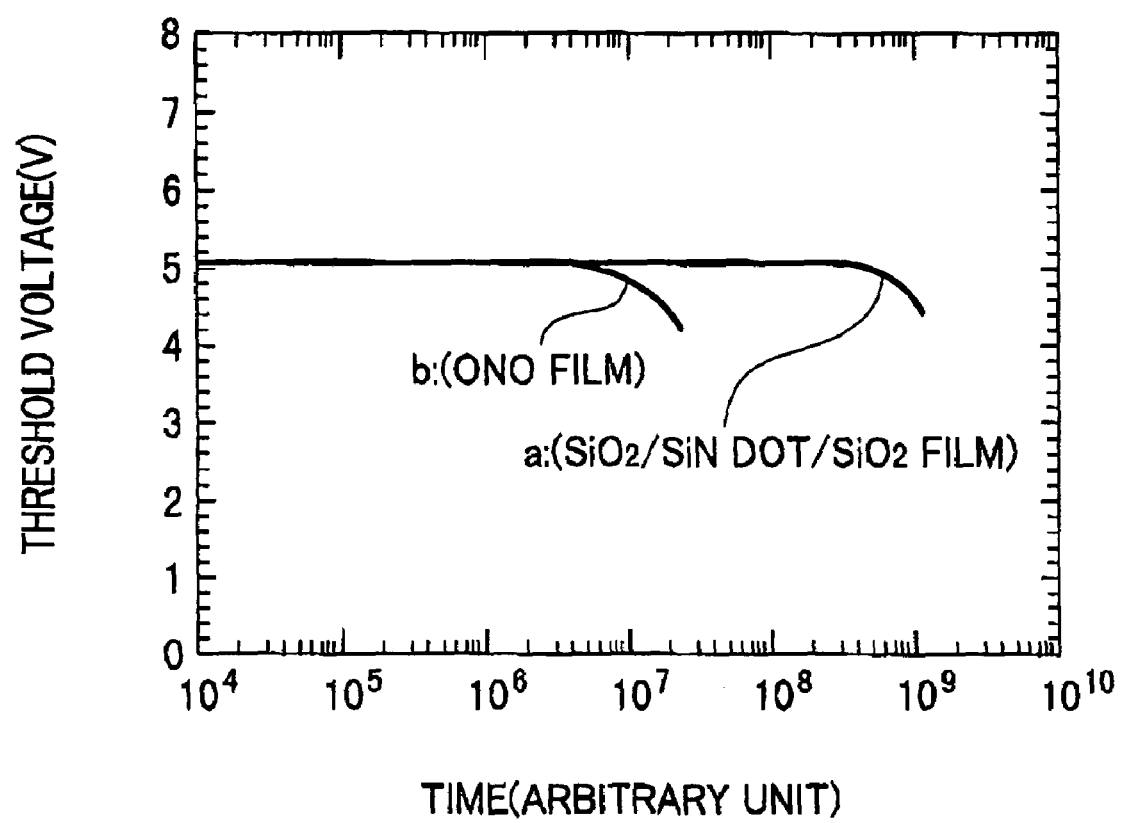
FIG. 17 illustrates charge holding characteristic of the nonvolatile semiconductor memory device in the first embodiment of this invention.

FIG. 17 illustrates a result (graph "a") of measuring the charge holding characteristic of the memory cell of the nonvolatile semiconductor memory device formed in this embodiment. In FIG. 17, the vertical axis indicates threshold voltage (V) and the horizontal axis indicates time. For comparison, FIG. 17 also illustrates a result (graph "b") of measuring the charge holding characteristic of the conventional memory cell (e.g., of the nonvolatile semiconductor memory device described above with reference to FIGS. 85 to 89). As shown in FIG. 17, by forming the silicon nitride that serves as a charge injected region into the dot film instead of the continuous film, the reduction of the threshold voltage caused by the movement of charges in the channel direction is suppressed, thus improving the charge holding characteristic of the memory cell.

Further, even in the case where the memory cell formed in this embodiment is smaller in gate length than that of the memory cell of the conventional structure, this memory cell is capable of discriminating that data is programmed on the end portion B of the source and the end portion A of the drain shown in FIGS. 5 to 8 after being left for a long period of time. This is because the movement of charges in the channel direction is suppressed and charges on the end portion B of the source and those on the end portion A of the drain are not, therefore, mixed together even in the case where the memory cell has the small gate length.

As can be seen, according to this embodiment, it is advantageously possible improve the reliability of the nonvolatile semiconductor memory device. It is also advantageously possible to reduce a memory cell size.

Second Embodiment

The second embodiment of this invention will be described with reference to FIGS. 18 to 34.

Figure 18:
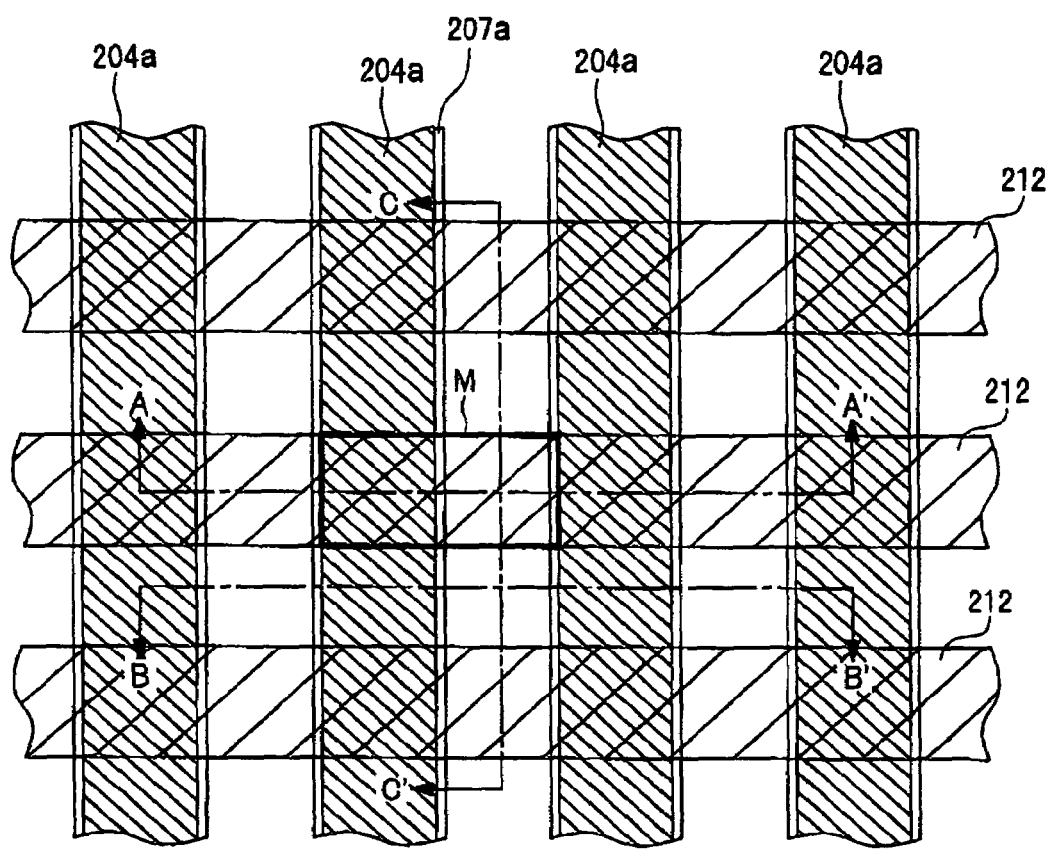
FIG. 18 is a plan view which illustrates important parts of a memory cell in a nonvolatile semiconductor memory device in the second embodiment of this invention.
Figure 19:
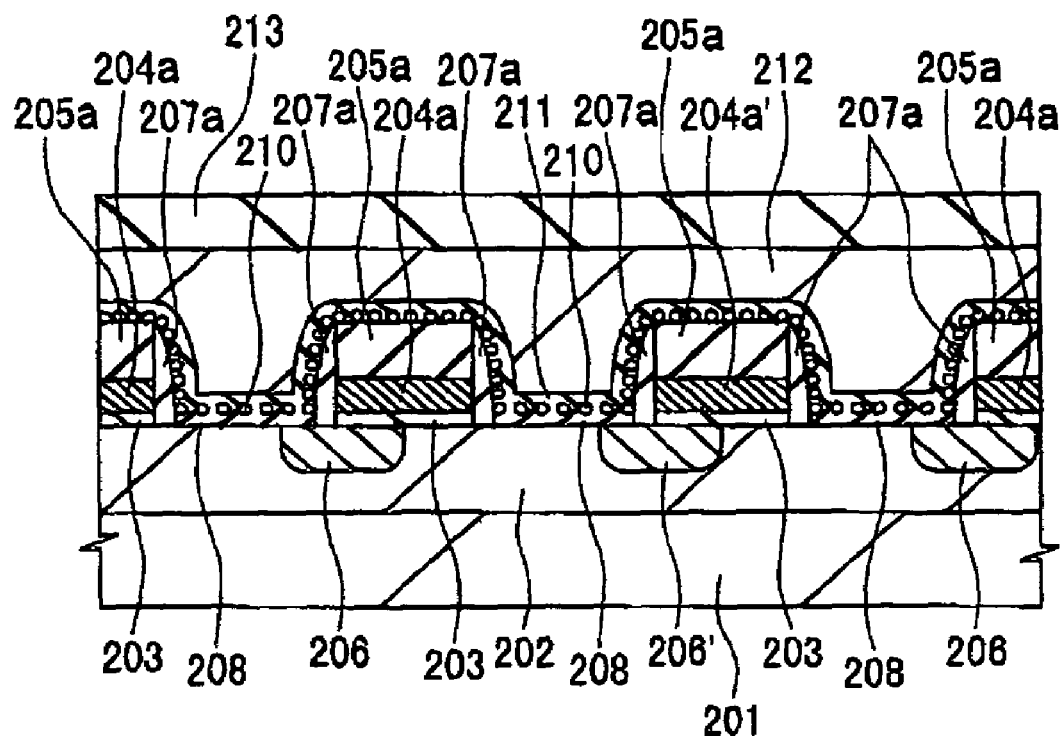
FIG. 19 is a cross-sectional view which illustrates important parts of the memory cell in the nonvolatile semiconductor memory device in the second embodiment of this invention.
Figure 20:
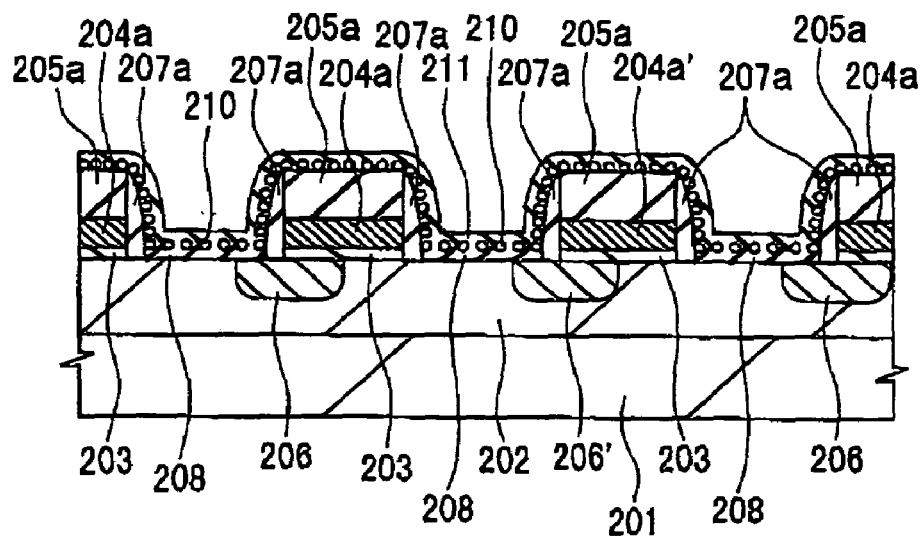
FIG. 20 is a cross-sectional view which illustrates important parts of the memory cell in the nonvolatile semiconductor memory device in the second embodiment of this invention.
Figure 21:
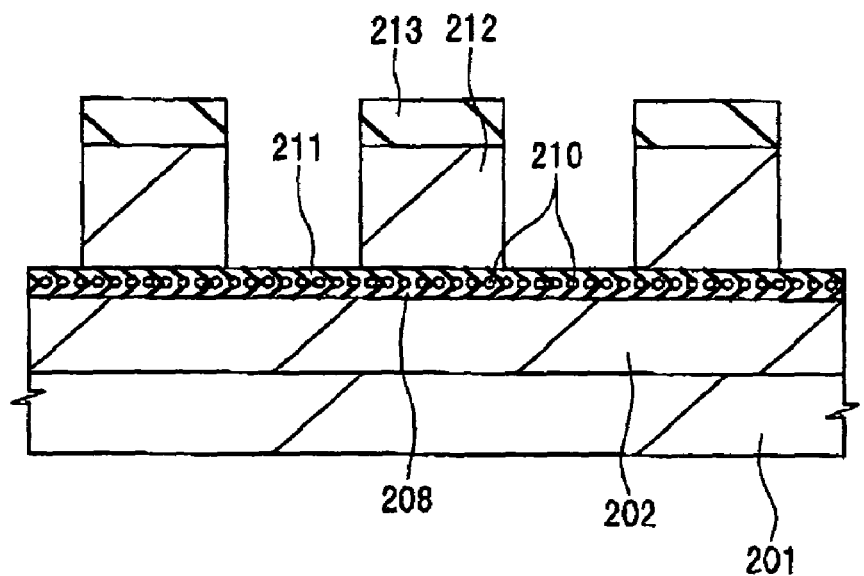
FIG. 21 is a cross-sectional view which illustrates important parts of the memory cell in the nonvolatile semiconductor memory device in the second embodiment of this invention.
Figure 22:
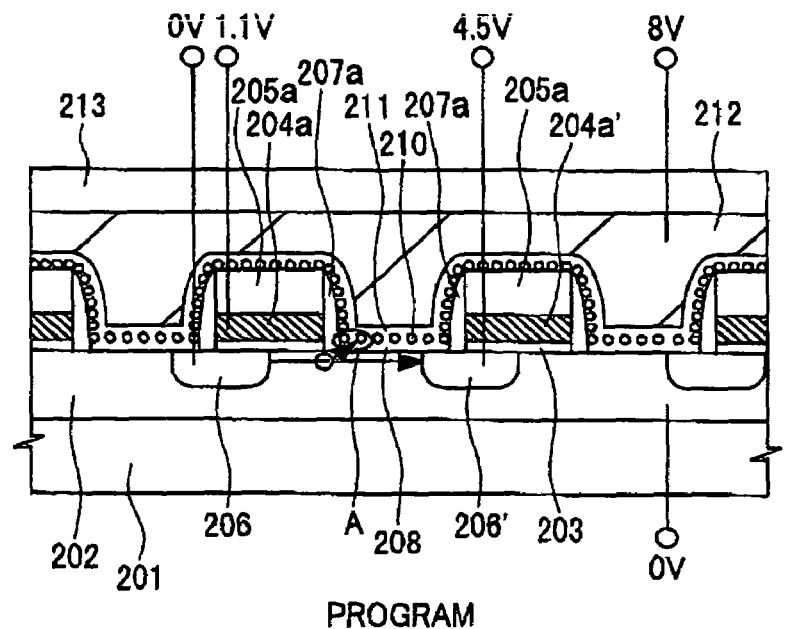
FIG. 22 is a cross-sectional view for describing operations of the nonvolatile semiconductor memory device in the second embodiment of this invention.
Figure 23:
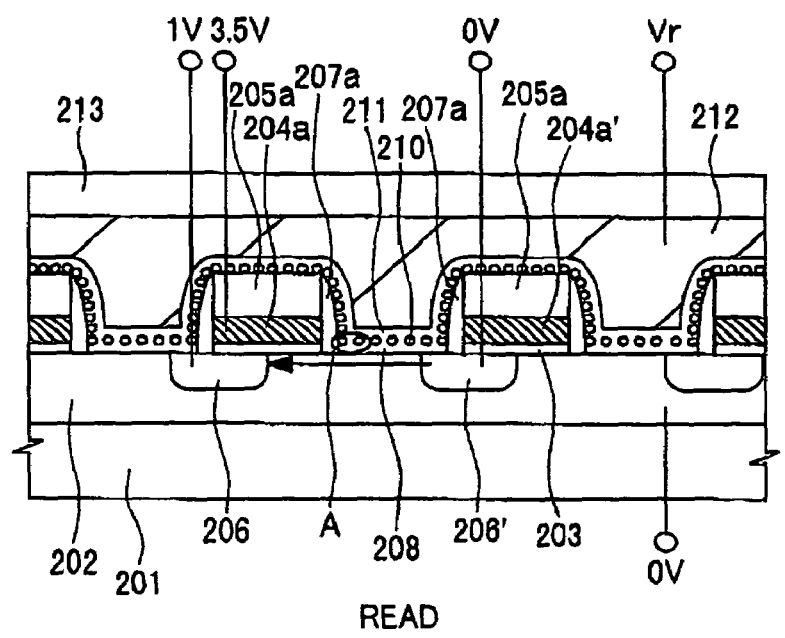
FIG. 23 is a cross-sectional view for describing operations of the nonvolatile semiconductor memory device in the second embodiment of this invention.

FIG. 18 is a plan view of a memory cell array of a nonvolatile semiconductor memory device in the second embodiment. FIG. 19 is a cross sectional view taken along line A-A' of FIG. 18. FIG. 20 is a cross sectional view taken along line B-B' of FIG. 18. FIG. 21 is a cross sectional view taken along line C-C' of FIG. 18. FIGS. 22 and 23 are cross-sectional views which illustrate program and read operation conditions of the memory cell. FIGS. 24 to 34 are cross-sectional views which illustrate important parts of a substrate and which illustrate a memory cell manufacturing process.

As shown in FIGS. 18 to 21, the memory cell in this embodiment comprises (second conductive type) source/drain diffusion layers 206 and 206' in a p-type (first conductive type) well 202 formed in a silicon substrate 201, silicon nitride dots 210 into which charges are injected, a control gate 212 serving as a first gate, and an assist gate 204a serving as a second gate. The control gates 212 of respective memory cells are connected to one another in a row direction and constitute word lines, respectively.

A silicon oxide film 208 serving as a first insulator film isolates the silicon nitride dots 210 from the p-type well 202. A silicon oxide film 211 serving as a second insulator film isolates the silicon nitride dots 210 from the control gate 212. The silicon oxide film 211 also functions to isolate the silicon nitride dots 210 from one another.

The source/drain diffusion layers 206 and 206' are arranged perpendicularly to the word line 212, and present as a local source line and a local data line that connect sources and drains of memory cells in a column direction. Namely, the nonvolatile semiconductor memory device in this embodiment consists of a so-called contactless array per memory cell in which no contact holes are provided. A channel is formed in a perpendicular direction to the diffusion layers 206 and 206'. In FIG. 18, reference numeral M denotes a memory cell region.

In this embodiment, only one of the paired diffusion layers 206 and 206' that form a source and a drain is present to overlap the assist gate 204a.

Program and read operations of the memory cell in this embodiment will be described with reference to FIGS. 22 and 23. In this embodiment, as shown in FIG. 22, electrons can be injected only into the silicon nitride dots 210 (a portion A in FIG. 22) on the channel adjacent to the source-side assist gate. In this case, a high positive voltage, e.g., about 8V is biased to the word line 212 and a low voltage, e.g., about 1.1V is biased to the assist gate 204a, and a voltage of about 4.5V is biased to the drain 206'. The source 206 and the p-type well 202 are kept at 0V. By doing so, an electric field in a horizontal direction to the channel increases on an end portion opposite to the source 206 in a channel section under the assist gate 204a, and hot electrons are generated therein and injected into the silicon nitride dots (the portion A in FIG. 22) adjacent to the assist gate 204a. That is, the assist gate 204a functions as the gate that controls the channel present under the assist gate 204a.

The memory cell in this embodiment is provided with the assist gate. Due to this, as compared with, for example, the nonvolatile semiconductor memory device described above with reference to FIGS. 85 to 89, the generation of hot electrons and injection efficiency improve and programming can be performed in a region having a low channel current. It is, therefore, possible to conduct parallel programming to many memory cells in the order of kilobytes or more with an internal voltage source substantially equal in current drivability to the conventional memory cell.

In a read operation, as shown in, for example, FIG. 23, independent positive voltages are biased to the word line 212, the source 206, and the assist gate 204a, respectively, and voltages of the p-type well 202, and the drain 206' are set at 0V. Symbol Vr denotes a read voltage.

In an erase operation, a negative voltage, for example, is biased to the word line 212, voltages of the p-type well 202, the source/drain 206 and 206', and the assist gates 204a and 204a' are set at 0V, and the electrons injected into the silicon nitride dots are ejected to the well.

A method of manufacturing the memory cell in this embodiment will next be described with reference to FIGS. 24 to 34.

Figure 24:
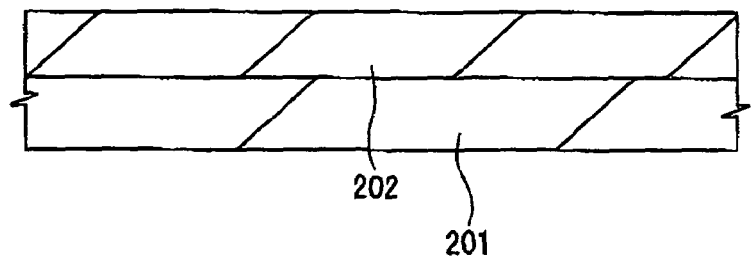
FIG. 24 is a cross-sectional view for describing a method of manufacturing the nonvolatile semiconductor memory device in the second embodiment of this invention.
Figure 25:
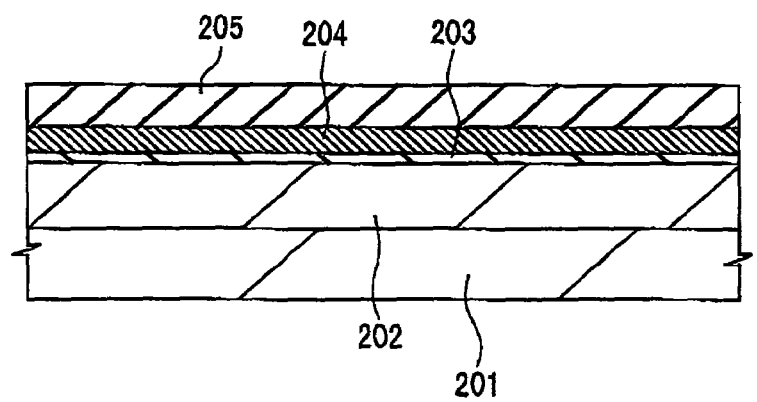
FIG. 25 is a cross-sectional view for describing a method of manufacturing the nonvolatile semiconductor memory device in the second embodiment of this invention.

First, the p-type well 202 is formed on the silicon substrate 201 (FIG. 24). A gate oxide film 203 that isolates the assist gate from the well 202 is formed by a well-known thermal oxidation method. Thereafter, a conductive film serving as the assist gate, e.g., a polysilicon film 204 doped with phosphorus impurities or the like and a silicon oxide film 205 are sequentially deposited (FIG. 25).

Figure 26:
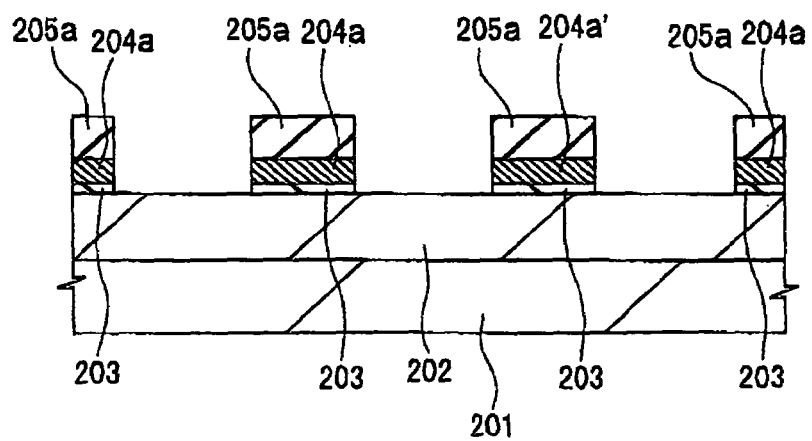
FIG. 26 is a cross-sectional view for describing a method of manufacturing the nonvolatile semiconductor memory device in the second embodiment of this invention.

Next, using the well-known lithographic and dry etching techniques, a silicon oxide film 205 and a polysilicon film 204 are patterned. As a result, the silicon oxide film 205 and the polysilicon film 204 are formed into the silicon oxide film 205' and the polysilicon film 204a, 204a' (FIG. 26).

Figure 27:
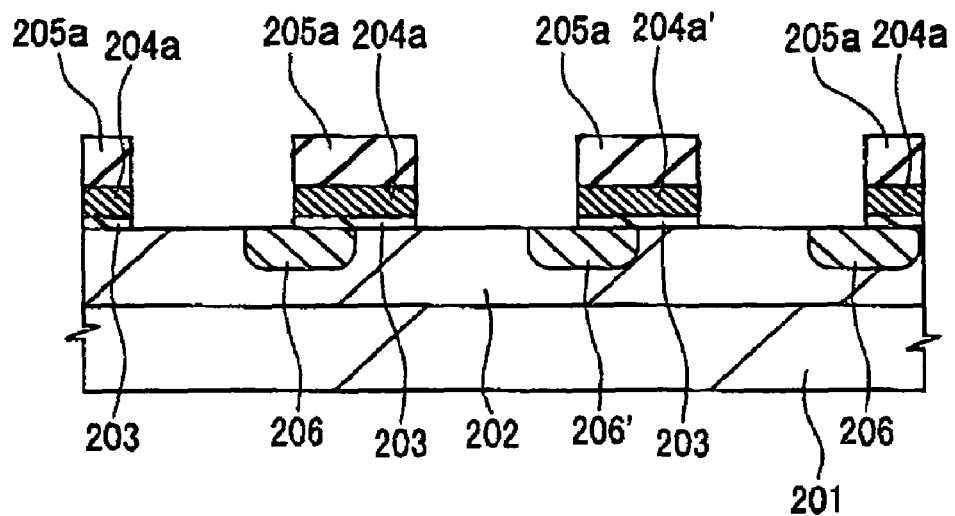
FIG. 27 is a cross-sectional view for describing a method of manufacturing the nonvolatile semiconductor memory device in the second embodiment of this invention.
Figure 28:
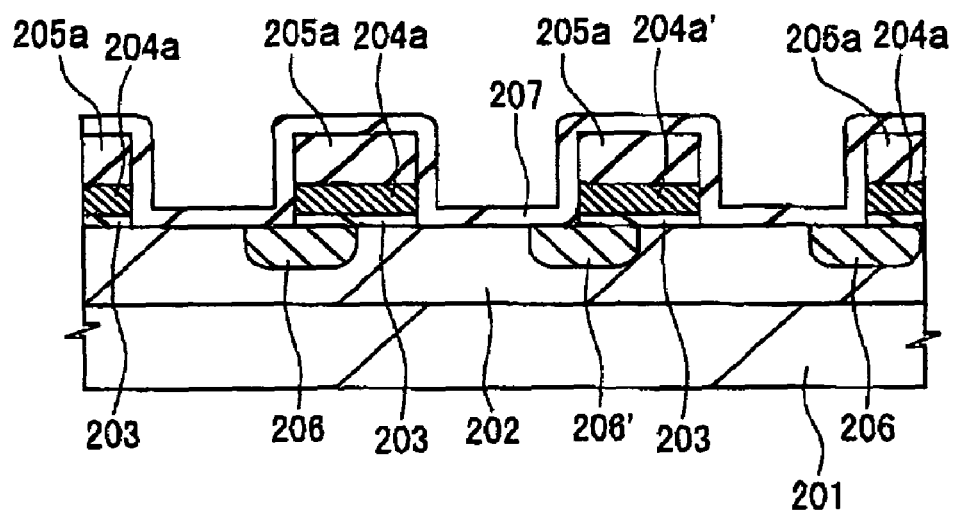
FIG. 28 is a cross-sectional view for describing a method of manufacturing the nonvolatile semiconductor memory device in the second embodiment of this invention.
Figure 29:
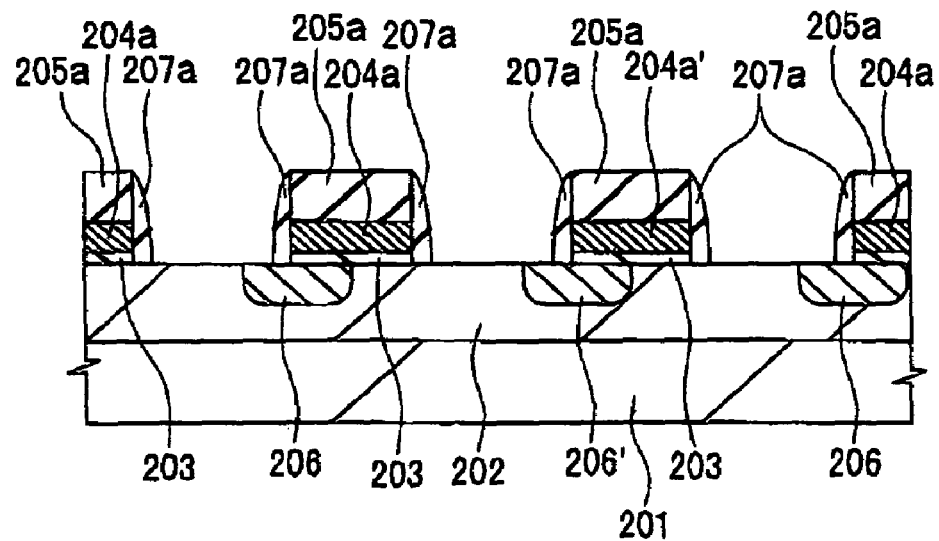
FIG. 29 is a cross-sectional view for describing a method of manufacturing the nonvolatile semiconductor memory device in the second embodiment of this invention.

N-type impurity ions such as arsenic ions are implanted by a tilted ion implantation method, thereby forming the diffusion layers 206 and 206' that serve as the source/drain of the memory cell (FIG. 27). A silicon oxide film 207 is deposited by a chemical vapor deposition (hereinafter "CVD") method (FIG. 28) and subjected to anisotropic etching to thereby leave the silicon oxide film 207 only on sidewalls of the assist gates (FIG. 29). As a result, the silicon oxide film 207 is formed into sidewalls 207a.

Figure 30:
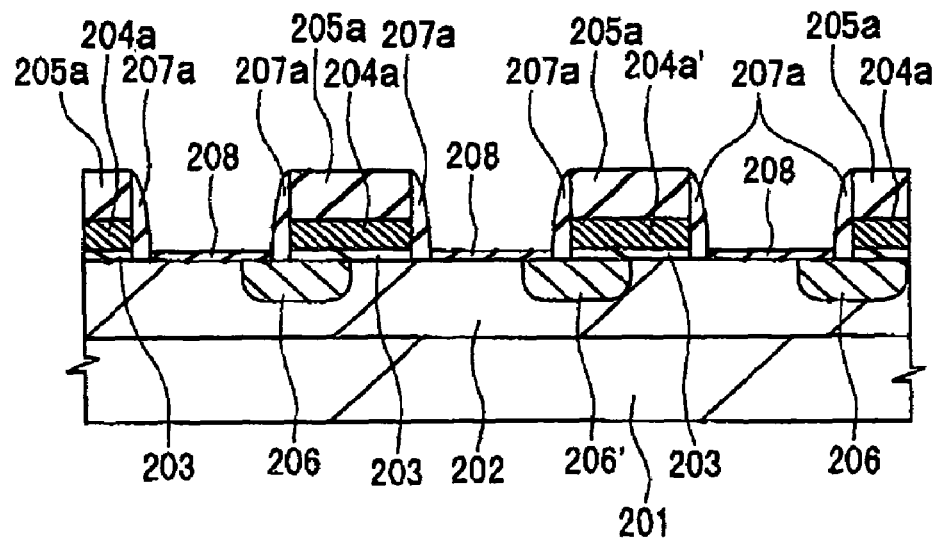
FIG. 30 is a cross-sectional view for describing a method of manufacturing the nonvolatile semiconductor memory device in the second embodiment of this invention.
Figure 31:
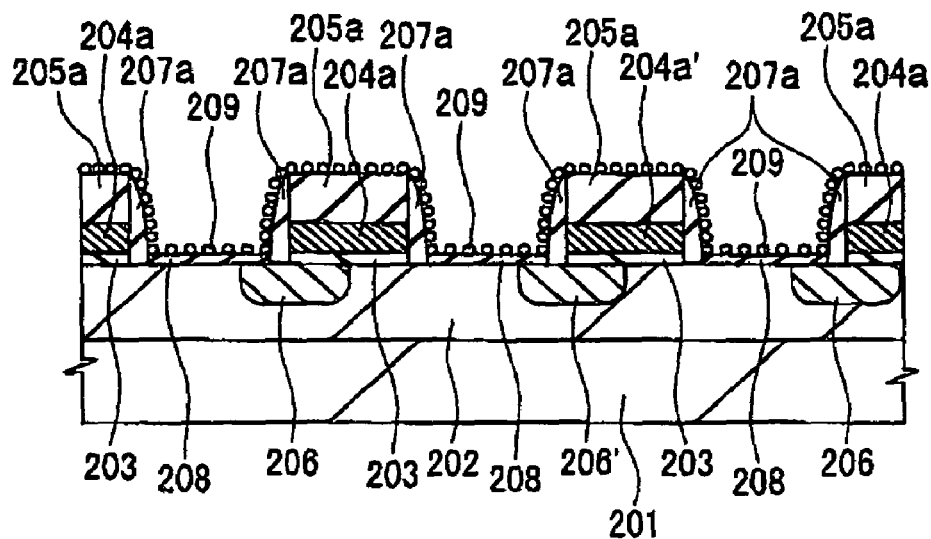
FIG. 31 is a cross-sectional view for describing a method of manufacturing the nonvolatile semiconductor memory device in the second embodiment of this invention.

A silicon oxide film 208 that isolates the silicon nitride dots from the well is formed by the thermal oxidation method (FIG. 30).

Figure 32:
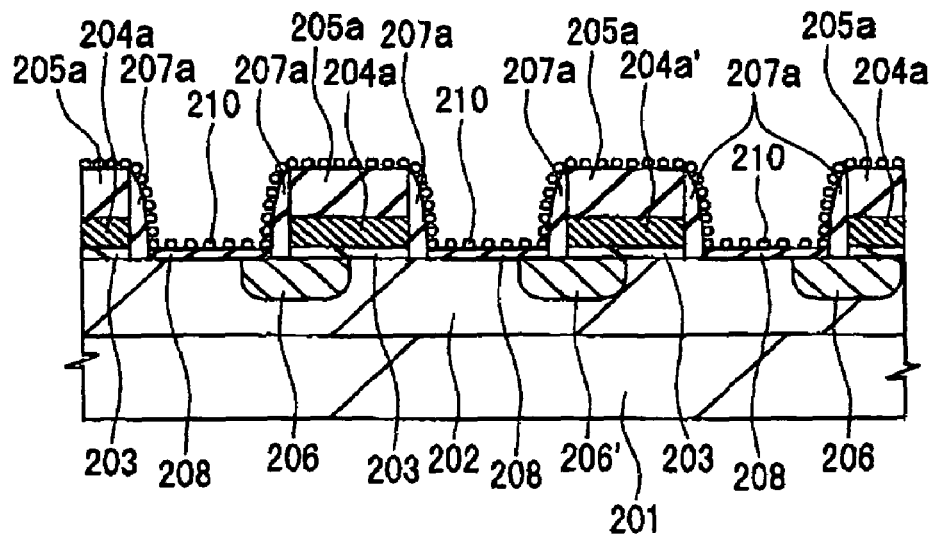
FIG. 32 is a cross-sectional view for describing a method of manufacturing the nonvolatile semiconductor memory device in the second embodiment of this invention.

Silicon nano-dots 209 are formed first by the LPCVD method (FIG. 31) and then subjected to plasma nitriding to thereby provide the silicon nitride dots 210 (FIG. 32). Since the silicon nano-dots and the nitriding treatment thereto are already described in the first embodiment, they will not be described herein in detail.

Figure 33:
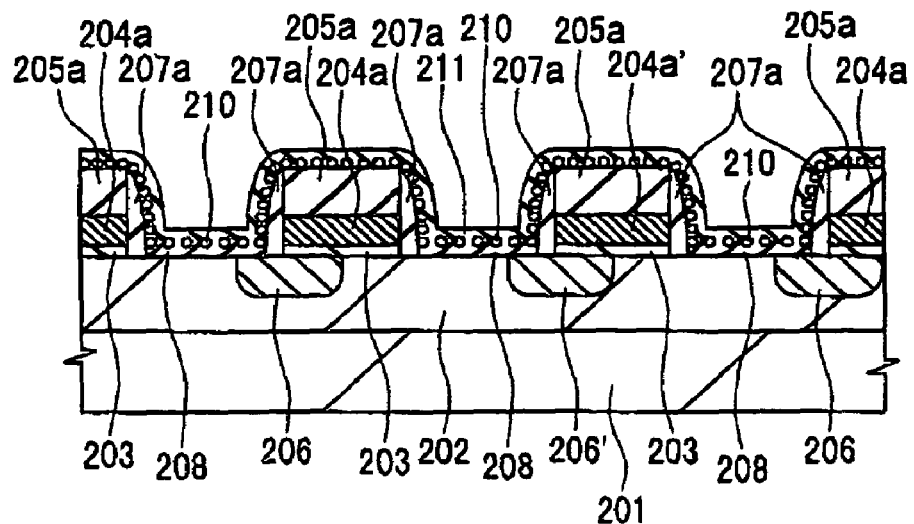
FIG. 33 is a cross-sectional view for describing a method of manufacturing the nonvolatile semiconductor memory device in the second embodiment of this invention.

Thereafter, the silicon oxide film 211 that isolates the silicon nitride dots from the control gate is formed by, for example, the CVD method (FIG. 33).

As can be seen, according to the second embodiment, the insulator film under the silicon nitride dots is the thermal oxide film and the oxide film above the silicon nitride dots is formed by the CVD method. Therefore, the following advantages can be attained. 1) It is possible to decrease the number of traps in the lower insulator film and reduce the movement of charges through this insulator film. 2) When the lower insulating film is the CVD film (deposited film), the insulator film is further deposited on the sidewalls of the silicon oxide film 207a. Therefore, a region between the assist gates, i.e., a silicon nitride dot formed region is made small in size. As a result, a charge trap region is made small in size and the quantity of injected charges decreases. On the other hand, when the thermal oxidation method is used, the distance between the assist gates can be secured and the quantity of injected charges can be increased. 3) When the insulator film is further deposited on the sidewalls of the silicon oxide film 207a, an increase in a channel electric field generated by the assist gate is relaxed and the generation of hot electrons and the injection efficiency are deteriorated. By using the thermal oxidation method, by contrast, the generation of hot electrons and the injection efficiency can be improved.

Figure 34:
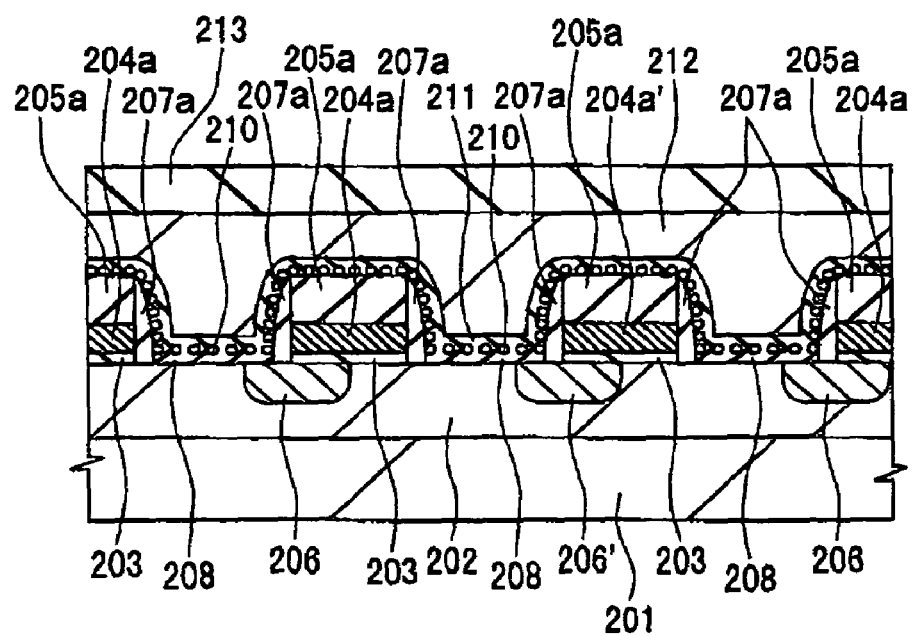
FIG. 34 is a cross-sectional view for describing a method of manufacturing the nonvolatile semiconductor memory device in the second embodiment of this invention.

Thereafter, a polysilicon-tungsten silicide stacked film or so-called polycide film 212 and a silicon oxide film 213 are deposited and patterned by well-known lithographic and dry etching techniques, thereby forming a word line (FIG. 34).

Although not shown in the drawings, after an interpoly dielectric film is deposited, contact holes leading to the word line 212, the assist gates 204a and 204a', the source/drain diffusion layers 206 and 206', and the p-type well 202 are formed in this interpoly dielectric film. A metal film is then deposited and patterned to form a metal wire. The memory cell of the nonvolatile semiconductor memory device is thus completed.

Similarly to the first embodiment, the charge holding characteristic of the memory cell in this embodiment is improved as compared with a case where silicon nitride into which charges are injected is formed as the continuous film.

As described above, according to the second embodiment, it is advantageously possible to improve the reliability of the nonvolatile semiconductor memory device.

In the memory cell having the assist gates, in particular, even when one bit is programmed to the memory cell, electrons are injected only into the silicon nitride dots (the portion A in FIG. 22) on the channel adjacent to the assist gate, that is, electrons are locally injected and the read operation is performed on the premise that the injected electrons are present in this portion. It is, therefore, necessary to effectively prevent the movement of the injected electrons.

Third Embodiment

The third embodiment of this invention will be described with reference to FIGS. 35 to 53. The third embodiment differs from the second embodiment in that charges are injected into two portions of one memory cell similarly to the first embodiment by contriving the arrangement of assist gates and source/drain diffusion layers.

Figure 35:
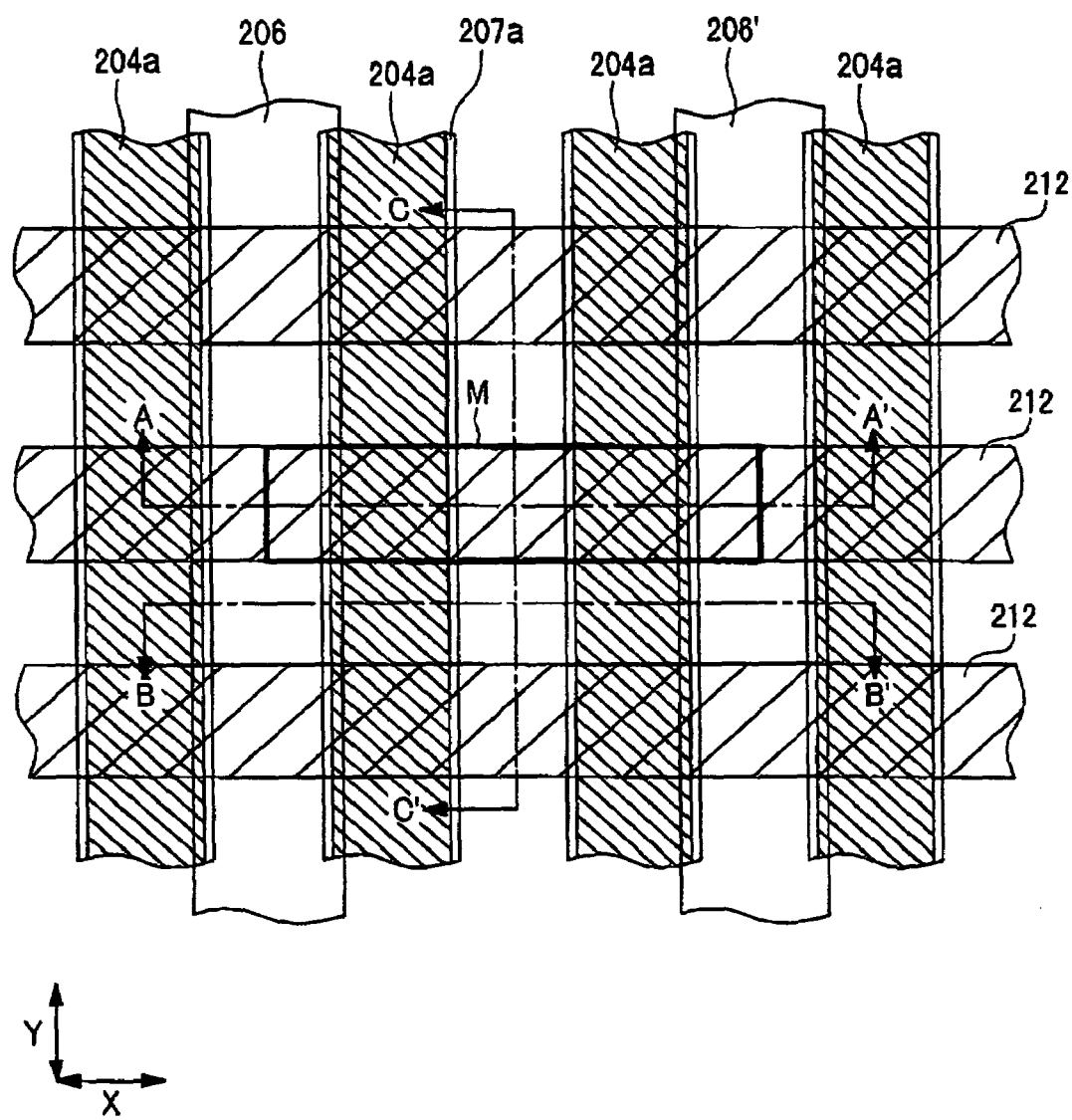
FIG. 35 is a plan view which illustrates important parts of a memory cell in a nonvolatile semiconductor memory device in the third embodiment of this invention.
Figure 36:
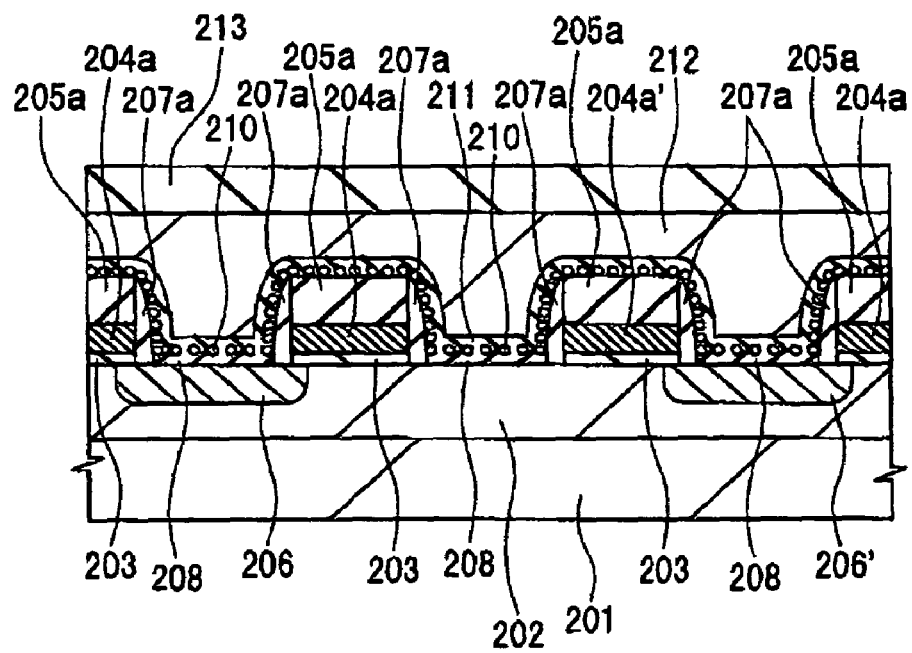
FIG. 36 is a cross-sectional view which illustrates important parts of the memory cell in the nonvolatile semiconductor memory device in the third embodiment of this invention.
Figure 37:
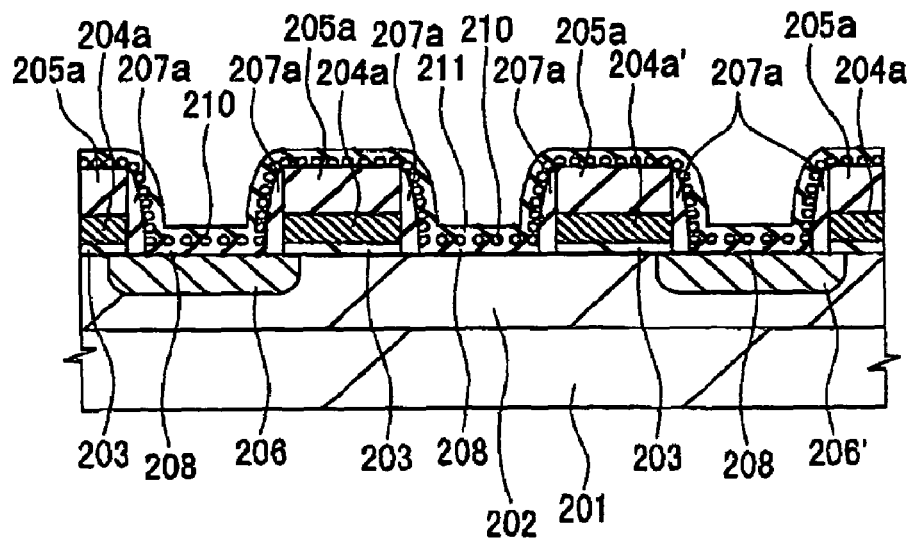
FIG. 37 is a cross-sectional view which illustrates important parts of the memory cell in the nonvolatile semiconductor memory device in the third embodiment of this invention.
Figure 38:
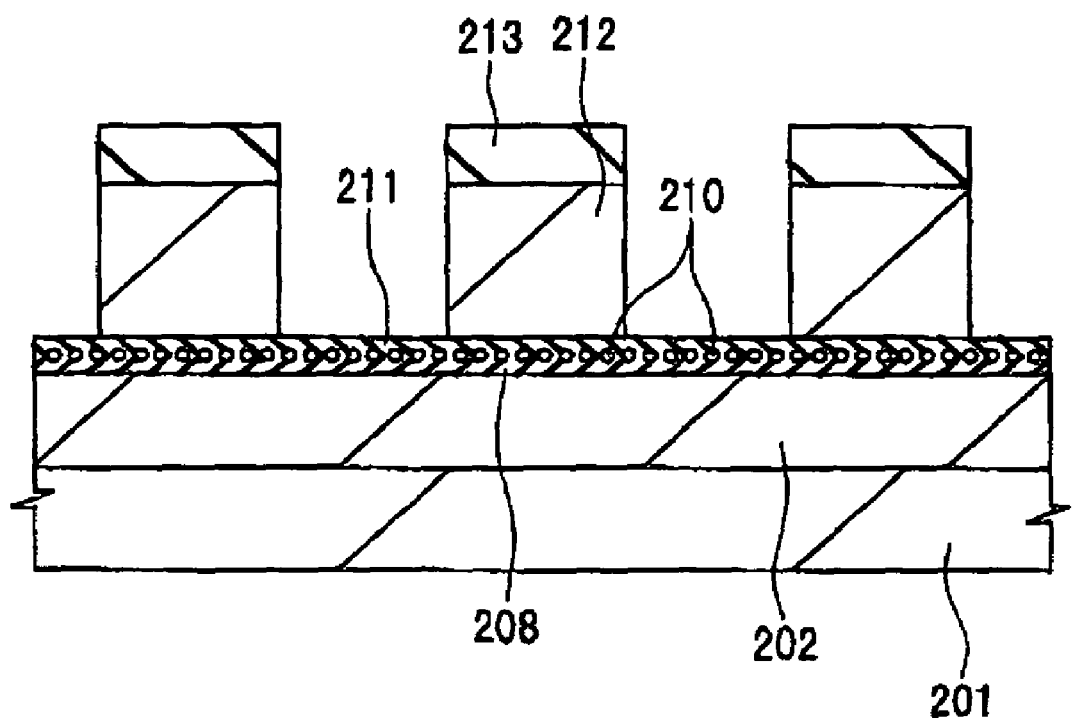
FIG. 38 is a cross-sectional view which illustrates important parts of the memory cell in the nonvolatile semiconductor memory device in the third embodiment of this invention.
Figure 39:
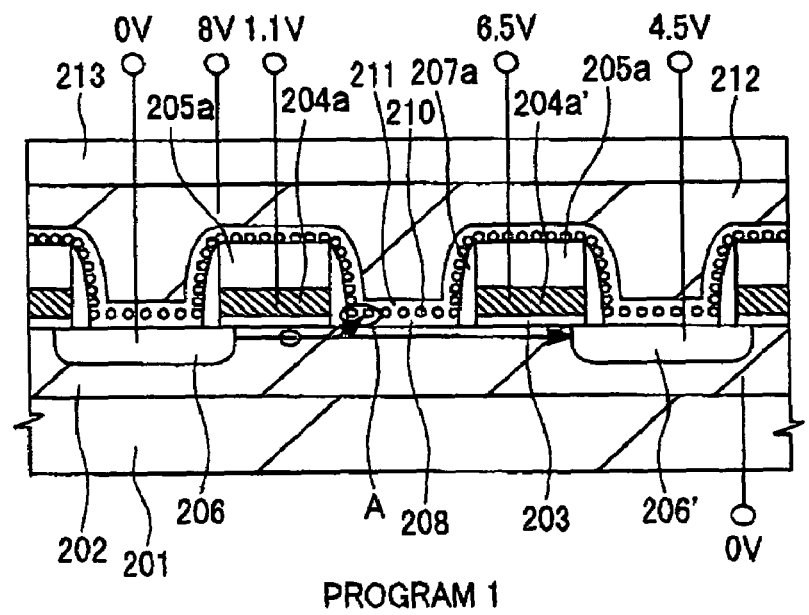
FIG. 39 is a cross-sectional view for describing operations of the nonvolatile semiconductor memory device in the third embodiment of this invention.

FIG. 35 is a plan view of a memory cell array of a nonvolatile semiconductor memory device in the third embodiment. FIG. 36 is a cross sectional view taken along line A-A' of FIG. 35. FIG. 37 is a cross sectional view taken along line B-B' of FIG. 35. FIG. 38 is a cross sectional view taken along line C-C' of FIG. 35. FIGS. 39 to 42 are cross-sectional views which illustrate program and read operation conditions of the memory cell. FIGS. 43 to 53 are cross-sectional views which illustrate important parts of a substrate and which illustrate a memory cell manufacturing process.

As shown in FIGS. 35 to 38, the memory cell in this embodiment comprises the (second conductive type) source/drain diffusion layers 206 and 206' in the p-type (first conductive type) well 202 formed in the silicon substrate 201, the silicon nitride dots 210 into which charges are injected, the control gate 212 serving as a first gate electrode, an assist gate 204a serving as a second gate electrode, and an assist gate 204a' serving as a third gate. The control gates 212 of respective memory cells are connected to one another in a row direction and constitute word lines, respectively.

The silicon oxide film 208 isolates the silicon nitride dots 210 from the p-type well 202. The silicon oxide film 211 isolates the silicon nitride dots 210 from the control gate 212. The silicon oxide film 211 also functions to isolate the silicon nitride dots 210 from one another.

The source/drain diffusion layers 206 and 206' are arranged perpendicularly to the word line 212, and present as a local source line and a local data line that connect sources and drains of memory cells in a column direction. Namely, the nonvolatile semiconductor memory device in this embodiment consists of a so-called contactless array per memory cell in which no contact holes are provided. The channel is formed in a perpendicular direction to the diffusion layers 206 and 206'.

In the third embodiment, differently from the second embodiment, the source/drain diffusion layers 206 and 206' are arranged in every other space section of a pattern of the assist gates (204a and 204a'). In FIG. 35, reference numeral M denotes a memory cell region.

Programming and read operations of the memory cell in this embodiment will be described with reference to FIGS. 39 to 42. First, when electrons are injected into the drain 206'-side silicon nitride dots (a portion A in FIG. 39), then a high positive voltage, e.g., about 8V, is biased to the word line 212 and a low voltage, e.g., about 1.1V is biased to the assist gate 204a that overlaps the source 206. A voltage of about 4.5V is biased to the drain 206'.

At this time, a high voltage, e.g., 6.5V at which a voltage of the channel under the assist gate 204a' is sufficiently inverted is biased to the assist gate 204a' that overlaps the drain 206'. In addition, the source 206 and the p-type well 202 are kept at 0V. By doing so, an electric field in a horizontal direction to the channel increases on an end portion opposite to the source 206 in a channel section under the assist gate 204a, and hot electrons are generated therein and injected into the silicon nitride dots (the portion A in FIG. 39) adjacent to the assist gate.

On the other hand, when electrons are injected into the source 206-side silicon nitride dots (a portion B in FIG. 41), then a high positive voltage, e.g., about 8V is biased to the word line 212, a low voltage, e.g., about 1.1V is biased to the assist gate 204a', and a voltage of, for example, 4.5V is biased to the source 206. In this case, the assist gate 204a is kept at about 6.5V and the drain 206' and the p-type well 202 are kept at 0V.

Figure 40:
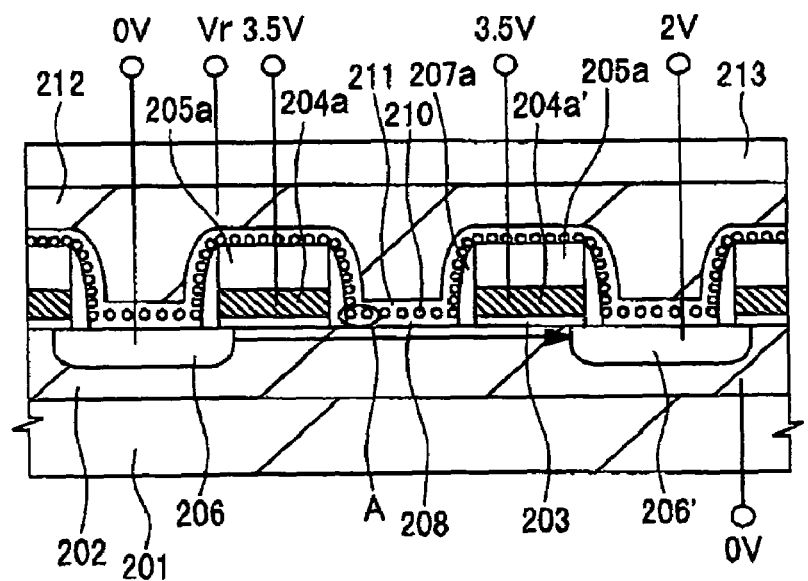
FIG. 40 is a cross-sectional view for describing operations of the nonvolatile semiconductor memory device in the third embodiment of this invention.
Figure 41:
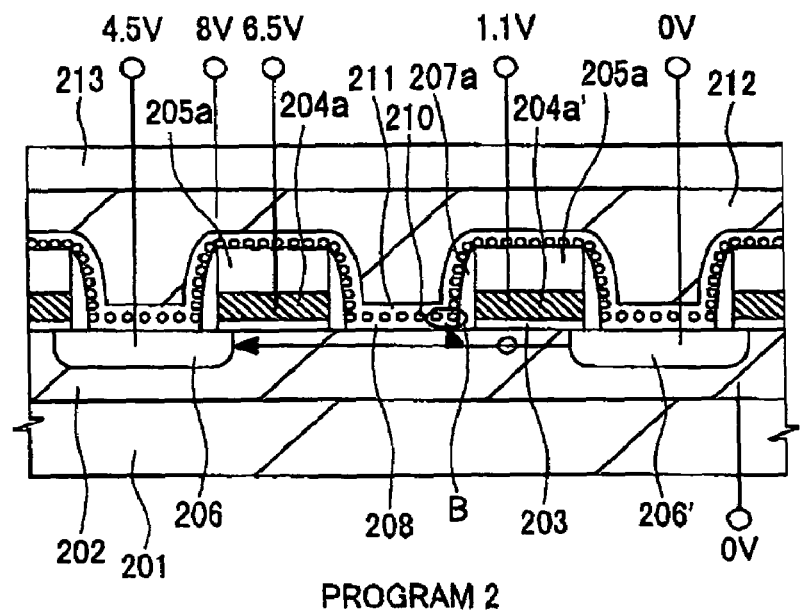
FIG. 41 is a cross-sectional view for describing operations of the nonvolatile semiconductor memory device in the third embodiment of this invention.
Figure 42:
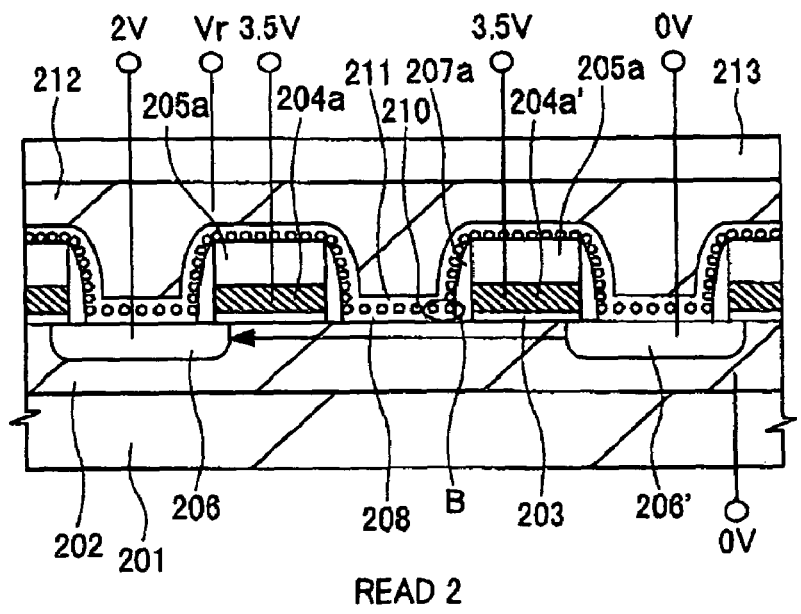
FIG. 42 is a cross-sectional view for describing operations of the nonvolatile semiconductor memory device in the third embodiment of this invention.

In a read operation, voltages of 3.5V are biased to the both assist gates 204a and 204a' so as to sufficiently invert the voltage of the channel under the assist gates, and a voltage of, for example, 2V is biased to the diffusion layer farther from the portion into which charges are injected. By doing so, it is possible to detect the injected electrons with high sensitivity. Symbol Vr denotes a read voltage (FIGS. 40 and 42).

In an erase operation, for example, a negative voltage is biased to the word line 212, voltages of the p-type well 202, the source/drain 206 and 206', and the assist gates 204a and 204a' are set at 0V, and the electrons injected into the silicon nitride dots are ejected to the well.

A method of manufacturing the memory cell in this embodiment will next be described with reference to FIGS. 43 to 53.

Figure 43:
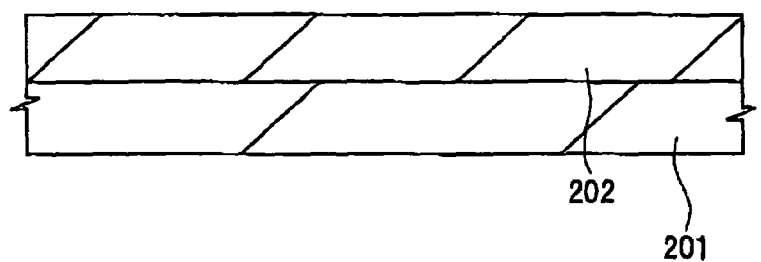
FIG. 43 is a cross-sectional view for describing a method of manufacturing the nonvolatile semiconductor memory device in the third embodiment of this invention.
Figure 44:
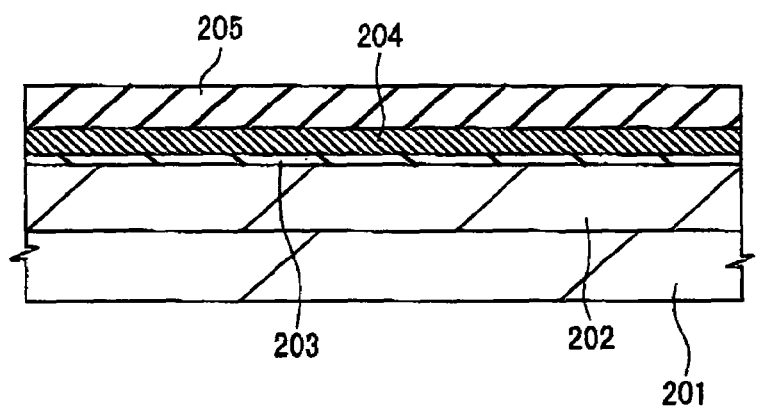
FIG. 44 is a cross-sectional view for describing a method of manufacturing the nonvolatile semiconductor memory device in the third embodiment of this invention.

First, the p-type well 202 is formed on the silicon substrate 201 (FIG. 43). The gate oxide film 203 that isolates the assist gate from the well 202 is formed by the well-known thermal oxidation method. Thereafter, the polysilicon film 204 doped with phosphorus impurities or the like and serving as the assist gate and the silicon oxide film 205 are sequentially deposited (FIG. 44).

Figure 45:
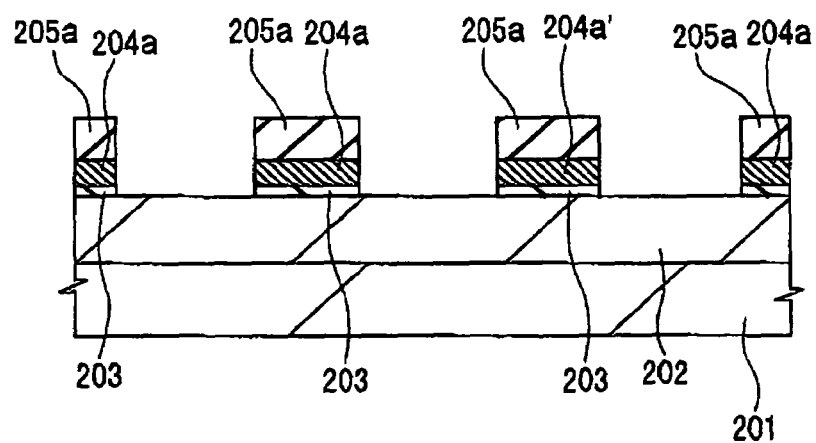
FIG. 45 is a cross-sectional view for describing a method of manufacturing the nonvolatile semiconductor memory device in the third embodiment of this invention.

Next, using the well-known lithographic and dry etching techniques, the silicon oxide film 205 and the polysilicon film 204 are patterned. As a result, the silicon oxide film 205 and the polysilicon film 204 are formed into the silicon oxide film 205a and the polysilicon film 204a, 204a' (FIG. 45).

Figure 46:
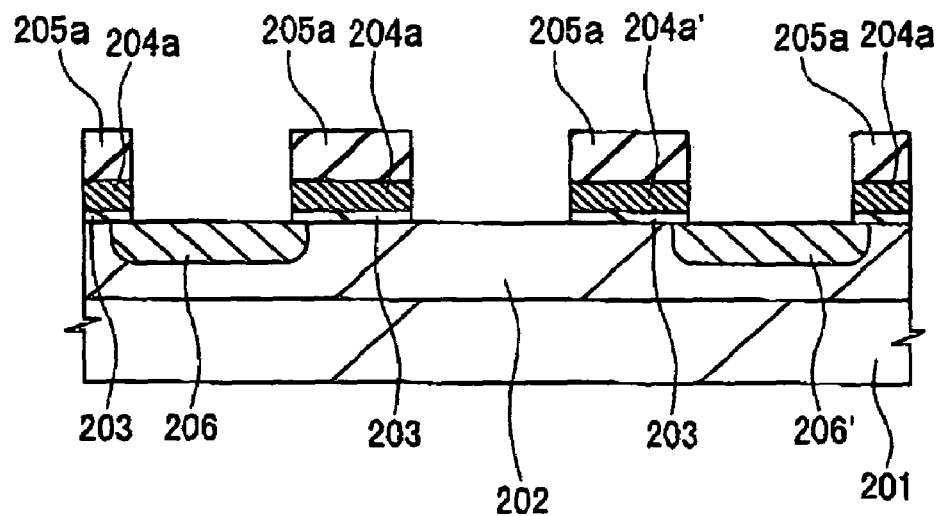
FIG. 46 is a cross-sectional view for describing a method of manufacturing the nonvolatile semiconductor memory device in the third embodiment of this invention.
Figure 47:
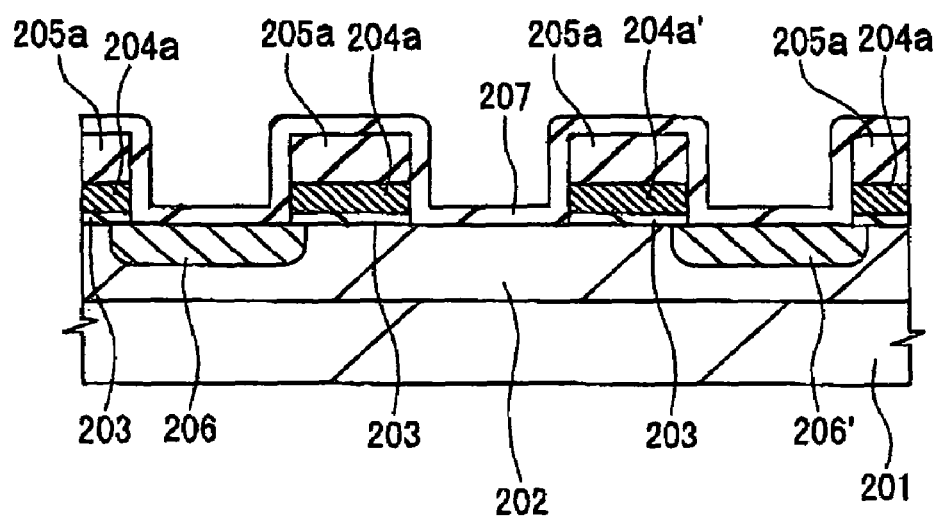
FIG. 47 is a cross-sectional view for describing a method of manufacturing the nonvolatile semiconductor memory device in the third embodiment of this invention.

N-type impurity ions such as arsenic ions are implanted by a vertical ion implantation method differently from the second embodiment, thereby forming the diffusion layers 206 and 206' that serve as the source/drain of the memory cell. At this time, a resist mask is used to form the diffusion layers in every other assist gate space (FIG. 46).

Figure 48:
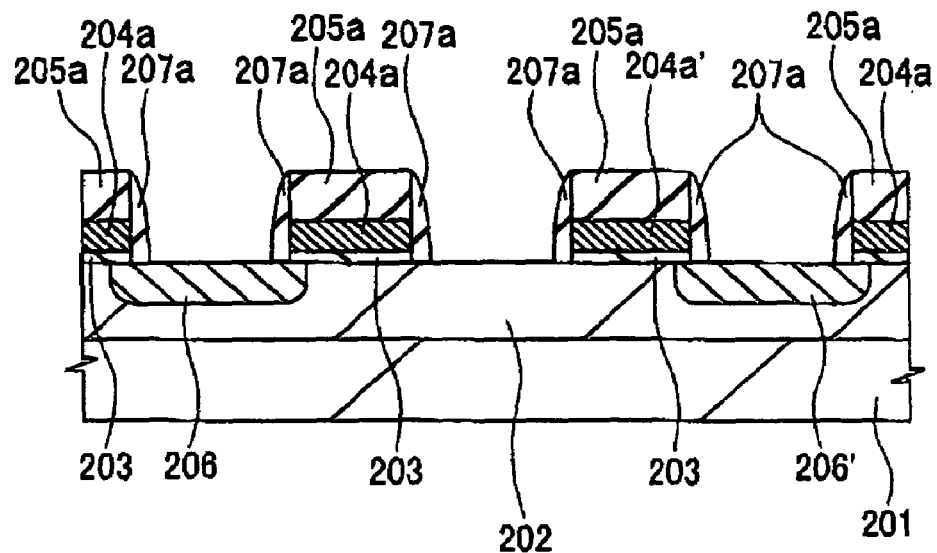
FIG. 48 is a cross-sectional view for describing a method of manufacturing the nonvolatile semiconductor memory device in the third embodiment of this invention.

Next, the silicon oxide film 207 is deposited by the CVD method (FIG. 47) and subjected to anisotropic etching to thereby leave the silicon oxide film 207 only on sidewalls of the assist gates (FIG. 48). As a result, the silicon oxide film 207 is formed into sidewalls 207a.

Figure 49:
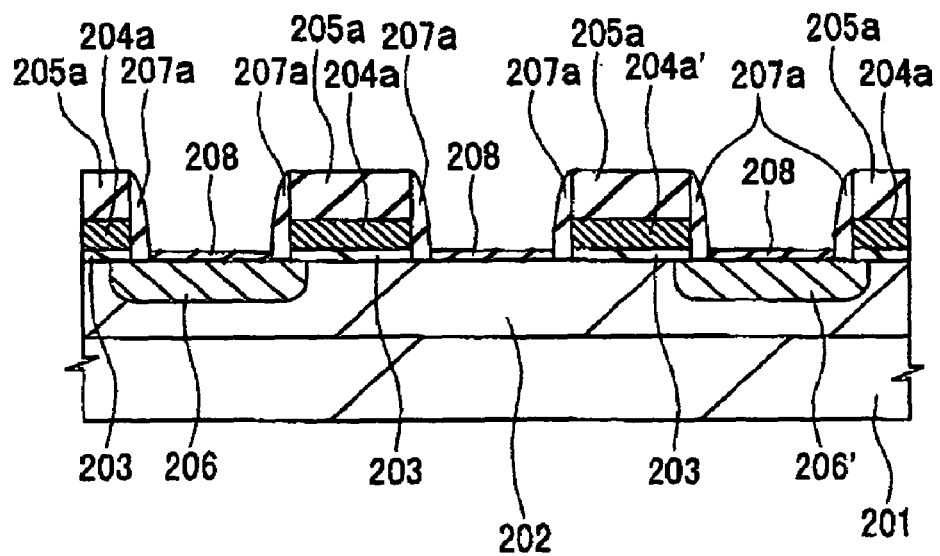
FIG. 49 is a cross-sectional view for describing a method of manufacturing the nonvolatile semiconductor memory device in the third embodiment of this invention.
Figure 50:
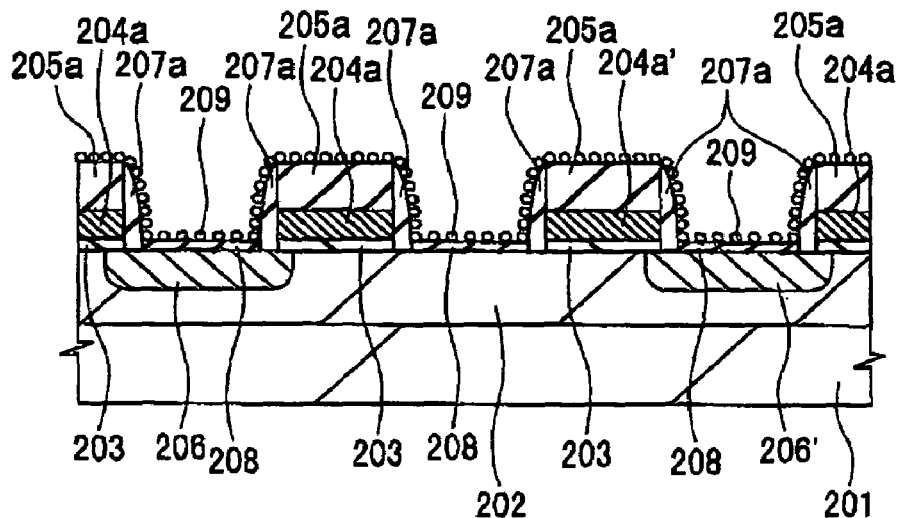
FIG. 50 is a cross-sectional view for describing a method of manufacturing the nonvolatile semiconductor memory device in the third embodiment of this invention.
Figure 51:
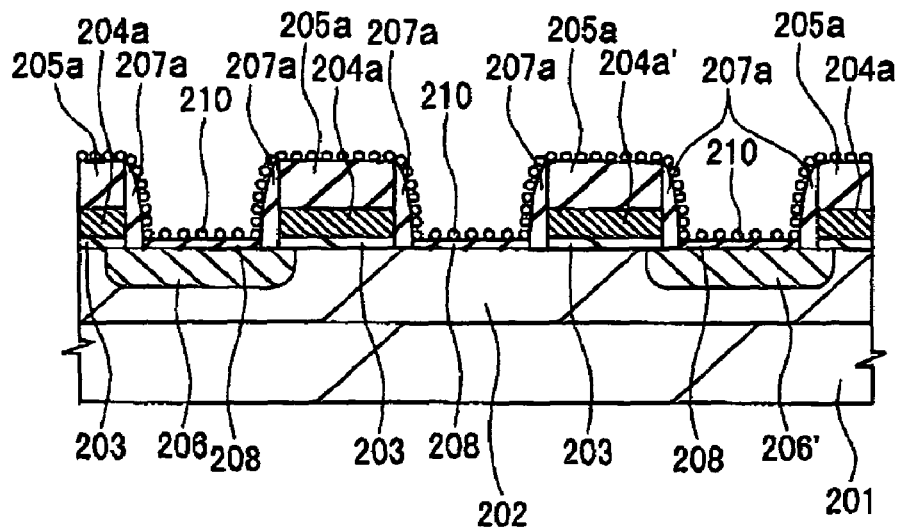
FIG. 51 is a cross-sectional view for describing a method of manufacturing the nonvolatile semiconductor memory device in the third embodiment of this invention.
Figure 52:
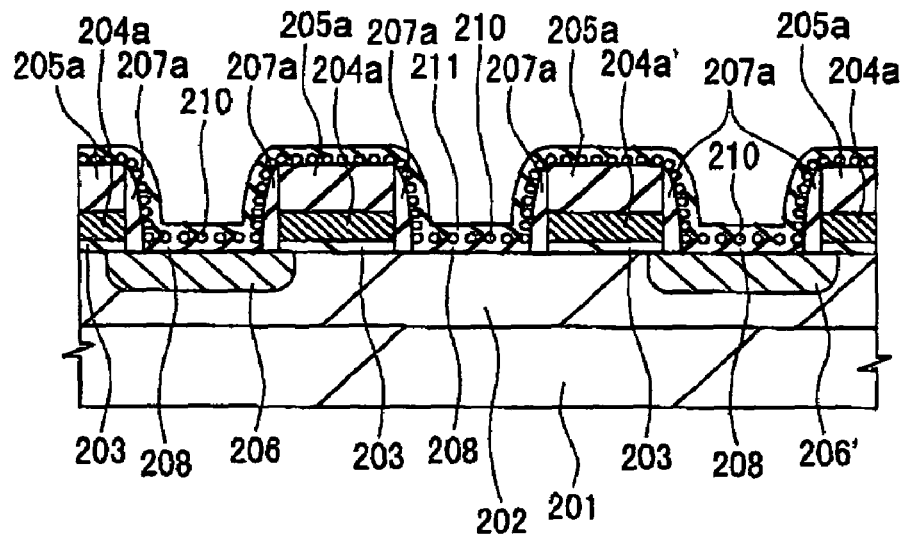
FIG. 52 is a cross-sectional view for describing a method of manufacturing the nonvolatile semiconductor memory device in the third embodiment of this invention.

The silicon oxide film 208 that isolates the silicon nitride dots from the well is formed by, for example, the CVD method (FIG. 49). Next, silicon nano-dots 209 are formed by the LPCVD method (FIG. 50). The silicon nano-dots 209 are then subjected to plasma nitriding to thereby provide the silicon nitride dots 210 (FIG. 51). The silicon oxide film 211 that isolates the silicon nitride dots from the control gate is formed by, for example, the CVD method (FIG. 52).

Since the silicon nano-dots and the nitriding treatment thereto are already described in the first embodiment, they will not be described herein in detail. Further, as described in the second embodiment in detail, by using the thermal oxide film as the insulator film under the silicon nitride dots and the deposited film is used the oxide film on the silicon nitride dots, it is advantageously possible to 1) decrease the number of traps in the lower insulator film, 2) secure the charge trap region, 3) increase the channel electric field, etc.

Figure 53:
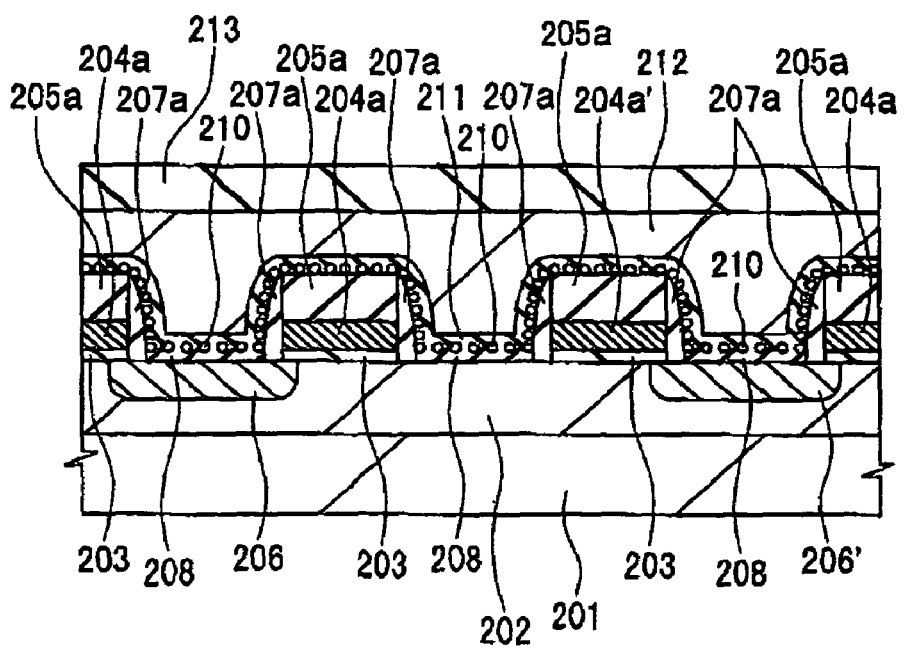
FIG. 53 is a cross-sectional view for describing a method of manufacturing the nonvolatile semiconductor memory device in the third embodiment of this invention.

Thereafter, the polysilicon-tungsten silicide stacked film or so-called polycide film 212 serving as the control gate and the silicon oxide film 213 are deposited and patterned by well-known lithographic and dry etching techniques, thereby forming the word line (FIG. 53).

Although not shown in the drawings, after the interpoly dielectric film is deposited, contact holes leading to the word line 212, the assist gates 204a and 204a', the source/drain diffusion layers 206 and 206', and the p-type well 202 are formed in this interpoly dielectric film. The metal film is then deposited and patterned to form a metal wire. The memory cell of the nonvolatile semiconductor memory device is thus completed.

Similarly to the first and second embodiment, the charge holding characteristic of the memory cell in this embodiment is improved as compared with a case where silicon nitride into which charges are injected is formed as the continuous film.

In addition, even in the case where the space between the assist gates is narrowed and the length of the channel formed by the silicon nitride dots is shortened, it is possible to discriminate states of the charges injected into the portions A and B shown in FIGS. 39 to 42, i.e., to store data of two bits after leaving the memory cell for a long period of time.

As described above, according to the third embodiment, it is advantageously possible to improve the reliability of the nonvolatile semiconductor memory device. It is also advantageously possible to reduce an memory cell area.

Fourth Embodiment

The fourth embodiment of this invention will be described with reference to FIGS. 54 to 72. The fourth embodiment differs from the third embodiment in that charges are injected not into both ends of silicon nitride formed regions located between the assist gates but into silicon nitride dots on both ends of the assist gates.

Figure 54:
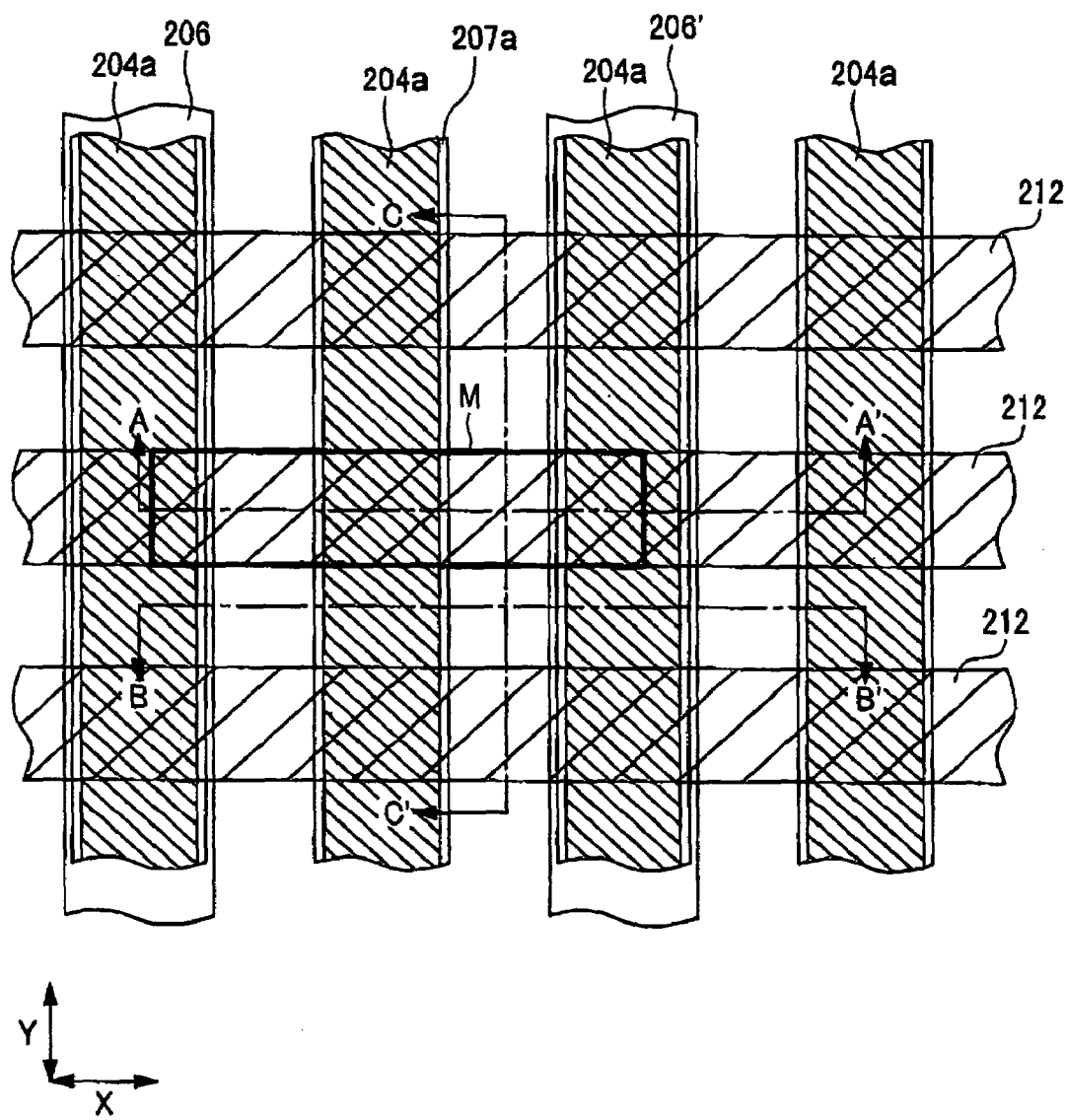
FIG. 54 is a plan view which illustrates important parts of a memory cell in a nonvolatile semiconductor memory device in the fourth embodiment of this invention.
Figure 55:
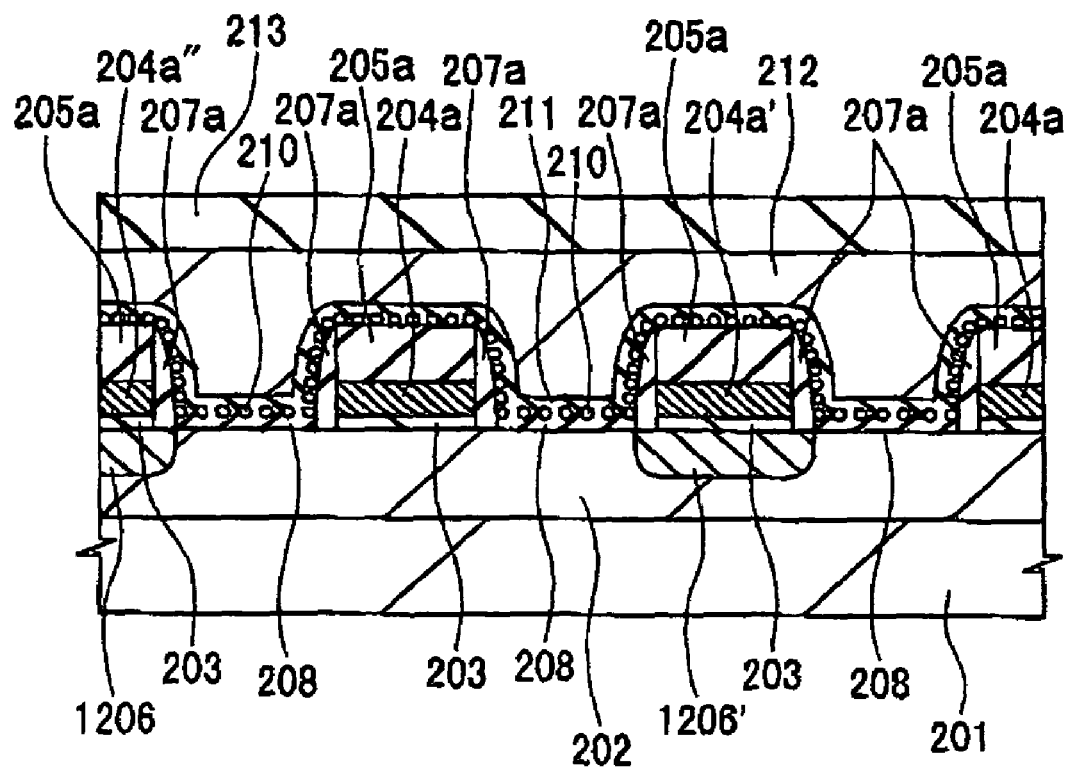
FIG. 55 is a cross-sectional view which illustrates important parts of the memory cell in the nonvolatile semiconductor memory device in the fourth embodiment of this invention.
Figure 56:
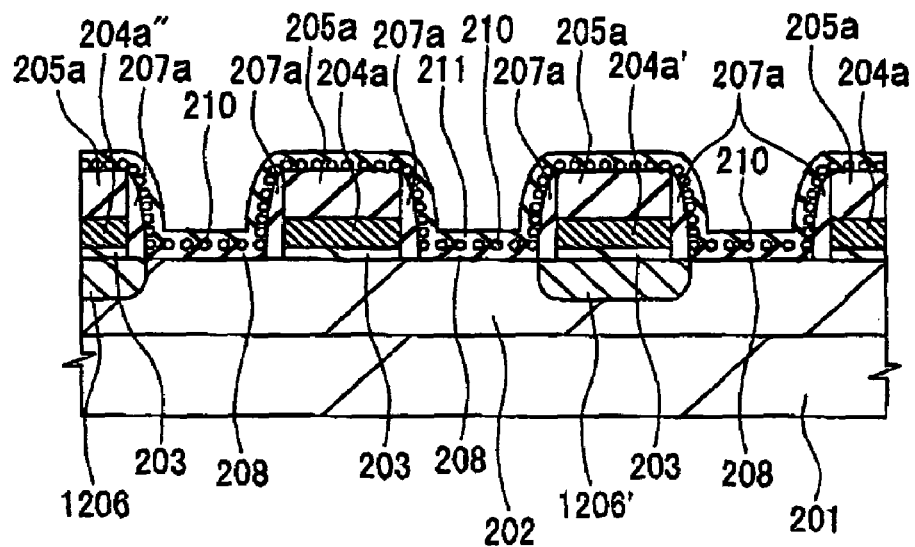
FIG. 56 is a cross-sectional view which illustrates important parts of the memory cell in the nonvolatile semiconductor memory device in the fourth embodiment of this invention.
Figure 57:
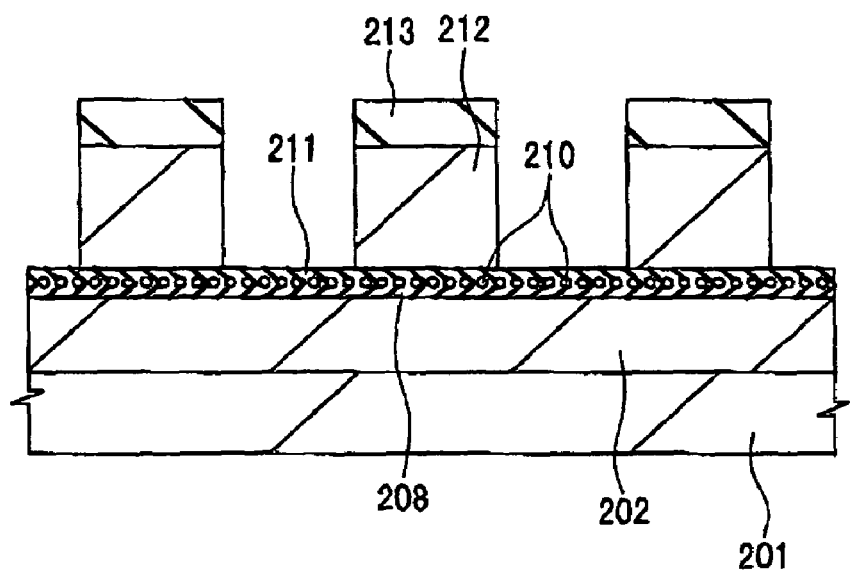
FIG. 57 is a cross-sectional view which illustrates important parts of the memory cell in the nonvolatile semiconductor memory device in the fourth embodiment of this invention.
Figure 58:
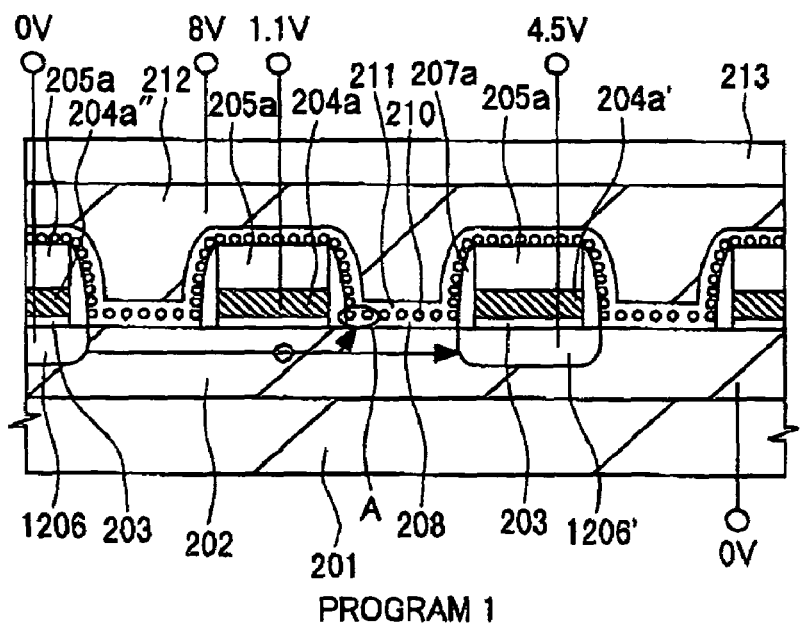
FIG. 58 is a cross-sectional view for describing operations of the nonvolatile semiconductor memory device in the fourth embodiment of this invention.
Figure 61:
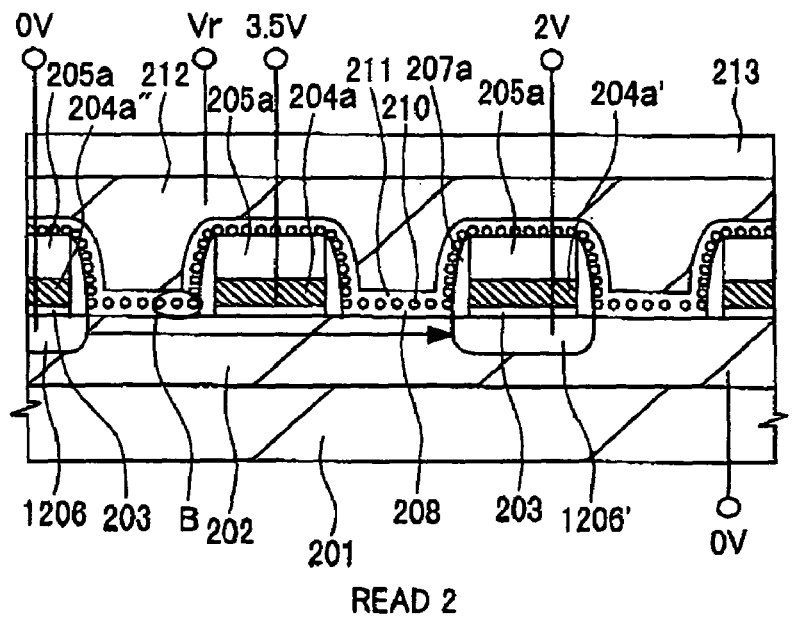
FIG. 61 is a cross-sectional view for describing operations of the nonvolatile semiconductor memory device in the fourth embodiment of this invention.

FIG. 54 is a plan view of a memory cell array of a nonvolatile semiconductor memory device in the fourth embodiment. FIG. 55 is a cross sectional view taken along line A-A' of FIG. 54. FIG. 56 is a cross sectional view taken along line B-B' of FIG. 54. FIG. 57 is a cross sectional view taken along line C-C' of FIG. 54. FIGS. 58 and 61 are cross-sectional views which illustrate program and read operation conditions of the memory cell. FIGS. 62 to 72 are cross-sectional views which illustrate important parts of a substrate and which illustrate a memory cell manufacturing process.

As shown in FIGS. 54 to 57, the memory cell in this embodiment consists of (second conductive type) source/drain diffusion layers 1206 and 1206' in the p-type (first conductive type) well 202 formed in the silicon substrate 201, the silicon nitride dots 210 into which charges are injected, the control gate 212 serving as the first gate electrode, the assist gate 204a serving as the second gate electrode, and assist gates 204a' and 204a" serving as third and fourth gates. The control gates 212 of respective memory cells are connected to one another in a row direction and constitute word lines, respectively.

The silicon oxide film 208 isolates the silicon nitride dots 210 from the p-type well 202. The silicon oxide film 211 isolates the silicon nitride dots 210 from the control gate 212. The silicon oxide film 211 also functions to isolate the silicon nitride dots 210 from one another.

The source/drain diffusion layers 1206 and 1206' are arranged perpendicularly to the word line 212, and present as a local source line and a local data line that connect sources and drains of memory cells in a column direction. Namely, the nonvolatile semiconductor memory device in this embodiment consists of a so-called contactless array per memory cell in which no contact holes are provided. The channel is formed in a perpendicular direction to the diffusion layers 1206 and 1206'.

In the fourth embodiment, differently from the third embodiment, the source/drain diffusion layers 1206 and 1206' are arranged in every other pattern of the assist gates. In FIG. 54, reference numeral M denotes a memory cell region.

Programming and read operations of the memory cell in this embodiment will be described with reference to FIGS. 58 to 61. First, when electrons are injected into the drain 1206'-side silicon nitride dots (a portion A in FIG. 58), then a high positive voltage, e.g., about 8V, is biased to the word line 212 and a voltage, e.g., about 1.1V at which the voltage of the channel under the assist gate 204a is slightly inverted is biased to the assist gate 204a. A voltage of about 4.5V is biased to the drain 1206'. The source 1206 and the p-type well 202 are kept at 0V.

By doing so, an electric field in the horizontal direction to the channel increases on an end portion opposite to the source 1206 in a channel section under the assist gate 204a, and hot electrons are generated and injected into the silicon nitride dots (the portion A in FIG. 58) adjacent to the assist gate.

On the other hand, when electrons are injected into the source 1206-side silicon nitride dots (a portion B in FIG. 60), then a high positive voltage, e.g., about 8V is biased to the word line 212, and a voltage, e.g., about 1.1V at which the voltage of the channel under the assist layer 204a is slightly inverted is biased to the assist gate 204a. In addition, a voltage of, for example, about 4.5V is biased to the source 1206. The drain 1206' and the p-type well 202 are kept at 0V.

Figure 59:
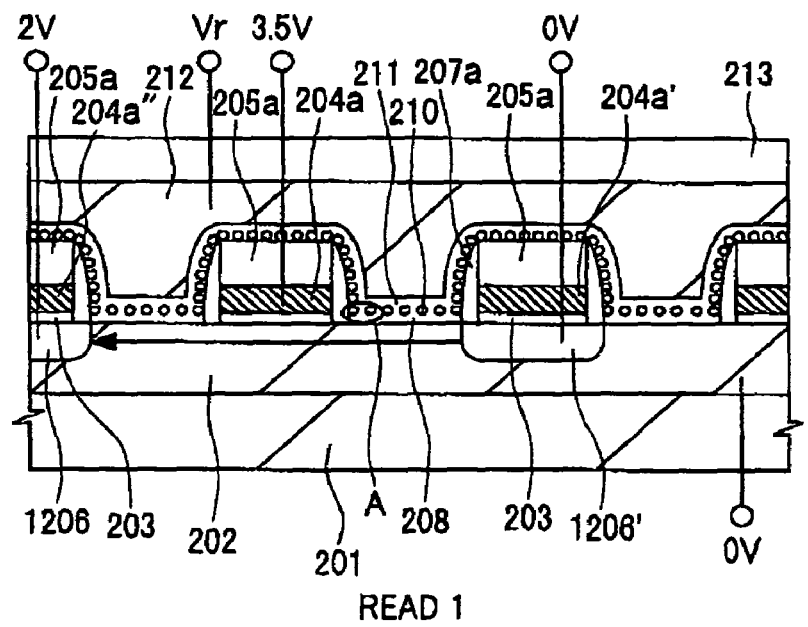
FIG. 59 is a cross-sectional view for describing operations of the nonvolatile semiconductor memory device in the fourth embodiment of this invention.
Figure 60:
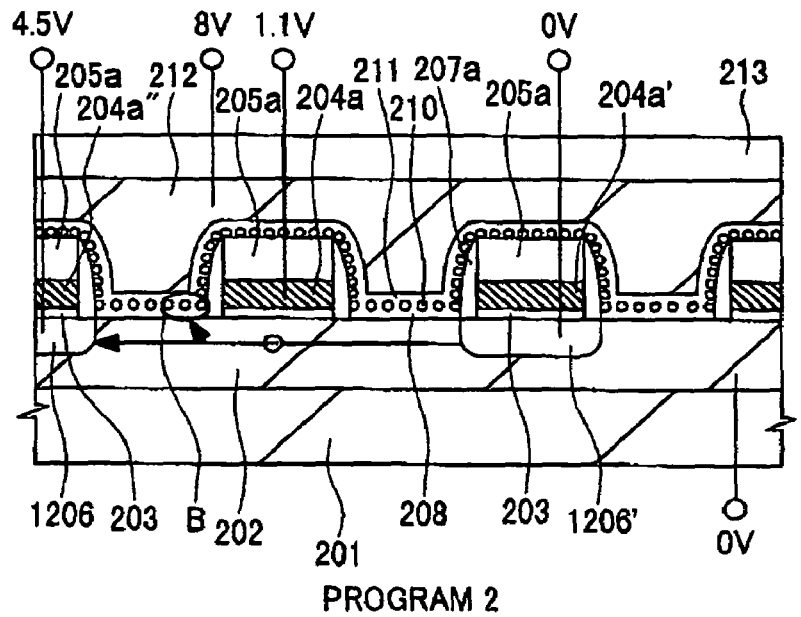
FIG. 60 is a cross-sectional view for describing operations of the nonvolatile semiconductor memory device in the fourth embodiment of this invention.

In a read operation, voltages of 3.5V are biased to the both assist gates 204a so as to sufficiently invert the voltage of the channel under the assist gates, and a voltage of, for example, 2V is biased to the diffusion layer farther from the portion into which charges are injected. By doing so, it is possible to detect the injected electrons with high sensitivity. Symbol Vr denotes a read voltage (FIGS. 59 and 61).

In an erase operation, a negative voltage, for example, is biased to the word line 212, voltages of the p-type well 202, the source/drain 1206 and 1206', and the assist gates 204a are set at 0V, and the electrons injected into the silicon nitride dots are ejected to the well.

A method of manufacturing the memory cell in this embodiment will next be described with reference to FIGS. 62 to 72.

Figure 62:
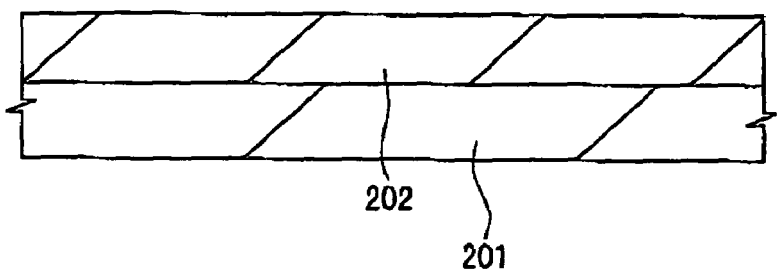
FIG. 62 is a cross-sectional view for describing a method of manufacturing the nonvolatile semiconductor memory device in the fourth embodiment of this invention.
Figure 63:
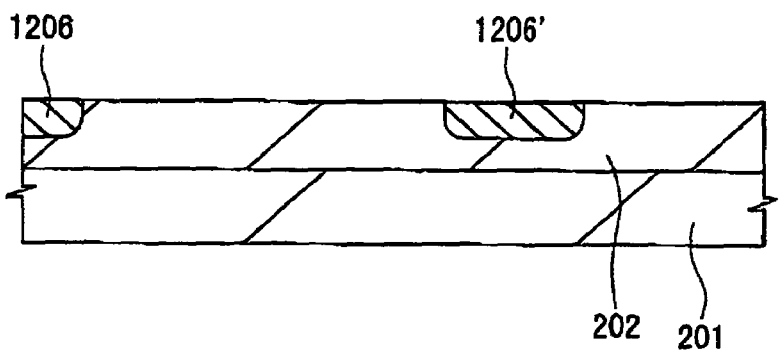
FIG. 63 is a cross-sectional view for describing a method of manufacturing the nonvolatile semiconductor memory device in the fourth embodiment of this invention.

First, the p-type well 202 is formed on the silicon substrate 201 (FIG. 62). Next, the diffusion layer regions 1206 and 1206' serving as the source and the drain of the memory cell are formed by the implantation of n-type impurity ions such as arsenic ions (FIG. 63).

In this case, differently from the third embodiment, the diffusion layer regions 1206 and 1206' are formed before the assist gates are formed. The assist gates are arranged on the diffusion layers 1206 and 1206' and between the diffusion layers 1206 and 1206'.

Figure 64:
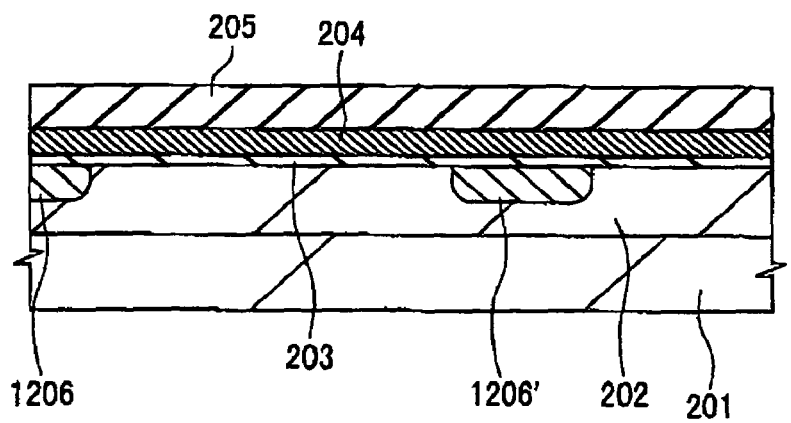
FIG. 64 is a cross-sectional view for describing a method of manufacturing the nonvolatile semiconductor memory device in the fourth embodiment of this invention.

The gate oxide film 203 that isolates the assist gate from the well 202 is formed by the well-known thermal oxidation method. Thereafter, the polysilicon film 204 doped with phosphorus impurities or the like and serving as the assist gates and the silicon oxide film 205 are sequentially deposited (FIG. 64).

Figure 65:
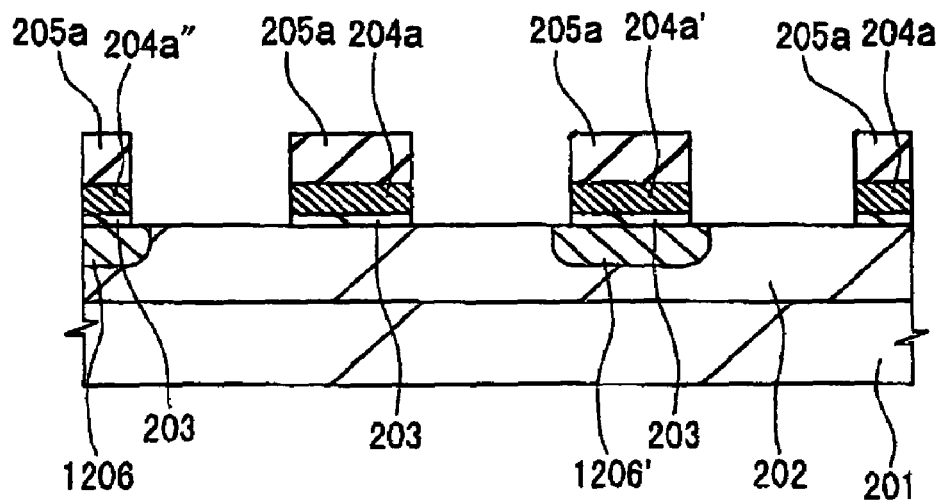
FIG. 65 is a cross-sectional view for describing a method of manufacturing the nonvolatile semiconductor memory device in the fourth embodiment of this invention.
Figure 66:
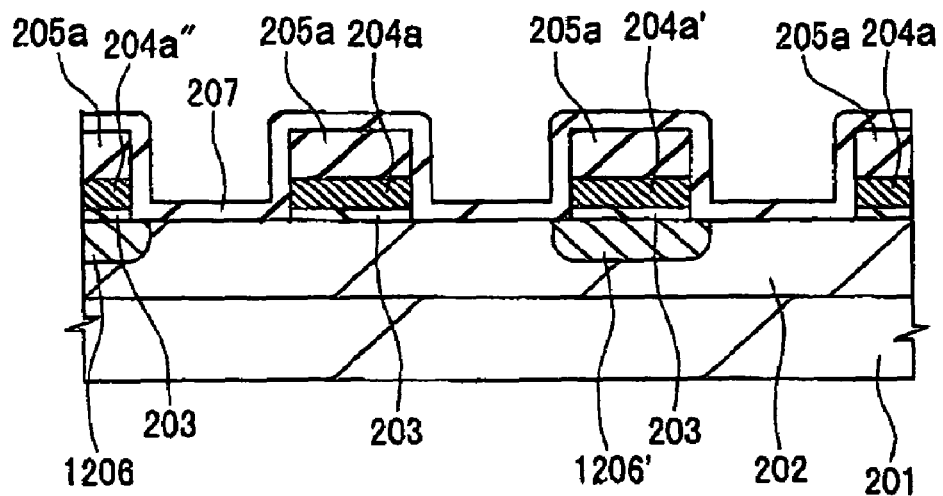
FIG. 66 is a cross-sectional view for describing a method of manufacturing the nonvolatile semiconductor memory device in the fourth embodiment of this invention.

Next, using the well-known lithographic and dry etching techniques, the silicon oxide film 205 and the polysilicon film 204 are patterned. As a result, the silicon oxide film 205 and the polysilicon film 204 are formed into the silicon oxide film 205a and the polysilicon film 204a, 204a', 204a" (FIG. 65).

Figure 67:
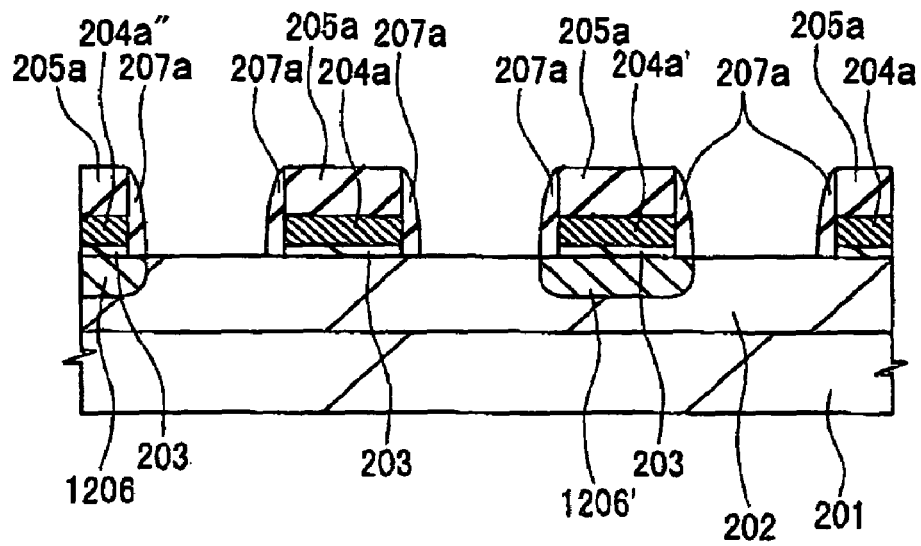
FIG. 67 is a cross-sectional view for describing a method of manufacturing the nonvolatile semiconductor memory device in the fourth embodiment of this invention.

The silicon oxide film 207 is deposited by the CVD method (FIG. 66) and subjected to anisotropic etching to thereby leave the silicon oxide film 207 only on sidewalls of the assist gates (FIG. 67). As a result, the silicon oxide film 207 is formed into sidewalls 207a.

Figure 68:
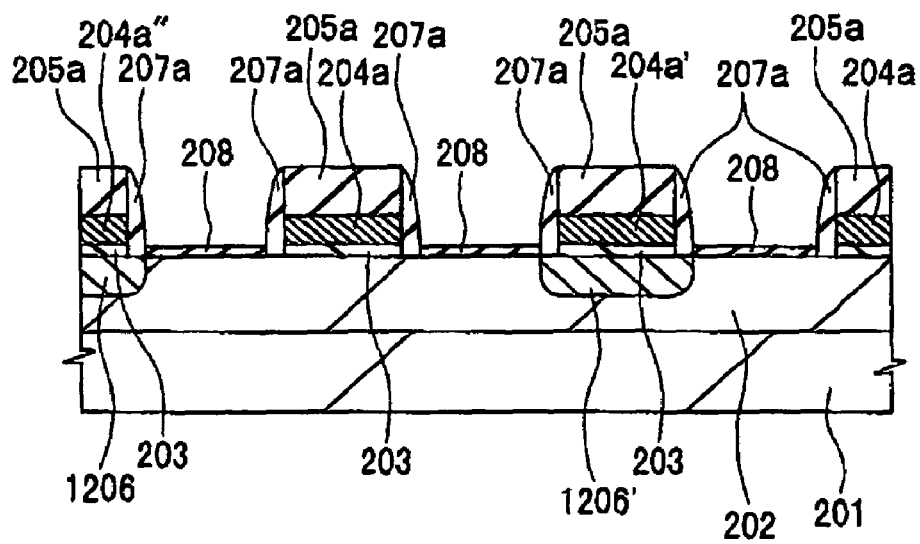
FIG. 68 is a cross-sectional view for describing a method of manufacturing the nonvolatile semiconductor memory device in the fourth embodiment of this invention.
Figure 69:
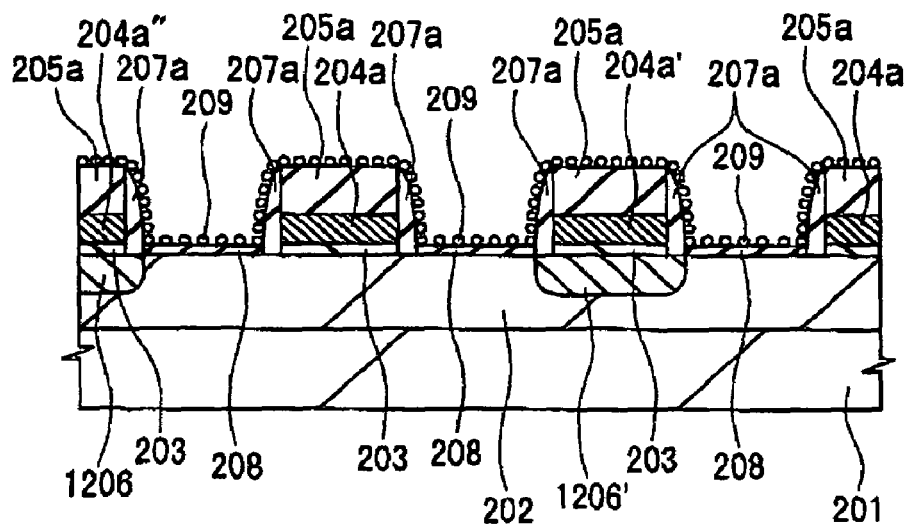
FIG. 69 is a cross-sectional view for describing a method of manufacturing the nonvolatile semiconductor memory device in the fourth embodiment of this invention.
Figure 70:
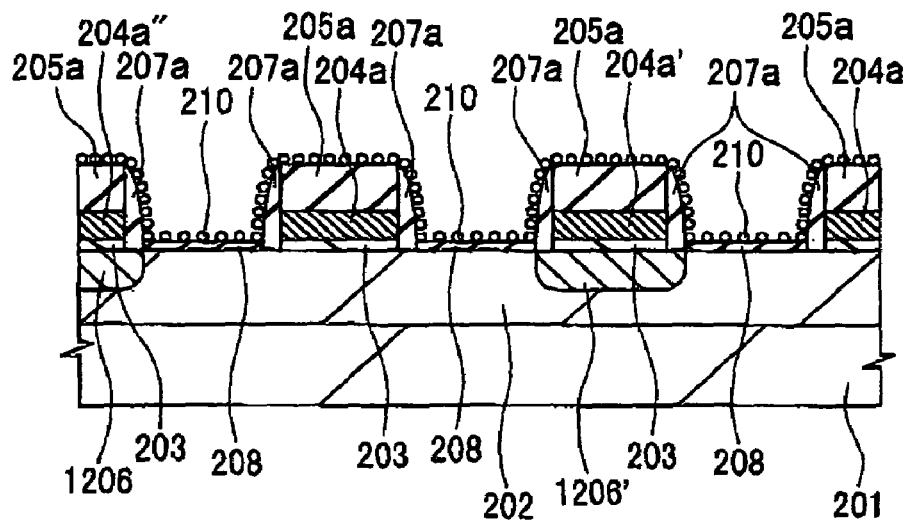
FIG. 70 is a cross-sectional view for describing a method of manufacturing the nonvolatile semiconductor memory device in the fourth embodiment of this invention.
Figure 71:
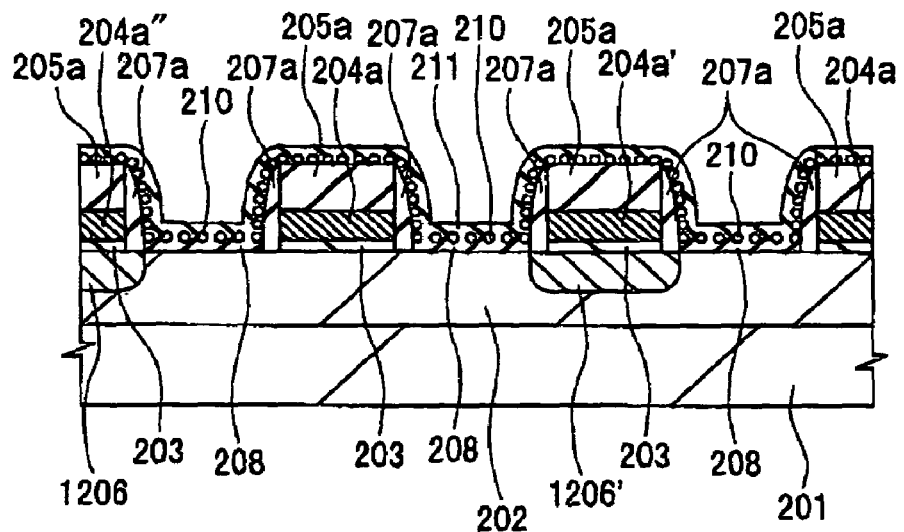
FIG. 71 is a cross-sectional view for describing a method of manufacturing the nonvolatile semiconductor memory device in the fourth embodiment of this invention.

The silicon oxide film 208 that isolates the silicon nitride dots from the well is formed by the thermal oxidation method (FIG. 68). Next, the silicon nano-dots 209 are formed by the LPCVD method (FIG. 69). The silicon nano-dots 209 are then subjected to plasma nitriding to thereby provide the silicon nitride dots 210 (FIG. 70). The silicon oxide film 211 that isolates the silicon nitride dots from the control gate is formed by, for example, the CVD method (FIG. 71).

Since the silicon nano-dots and the nitriding treatment thereto are already described in the first embodiment, they will not be described herein in detail. Further, as described in the second embodiment in detail, by using the thermal oxide film as the insulator film under the silicon nitride dots and the deposited film is used the oxide film on the silicon nitride dots, whereby it is advantageously possible to 1) decrease the number of traps in the lower insulator film, 2) secure the charge trap region, 3) increase the channel electric field, etc.

Figure 72:
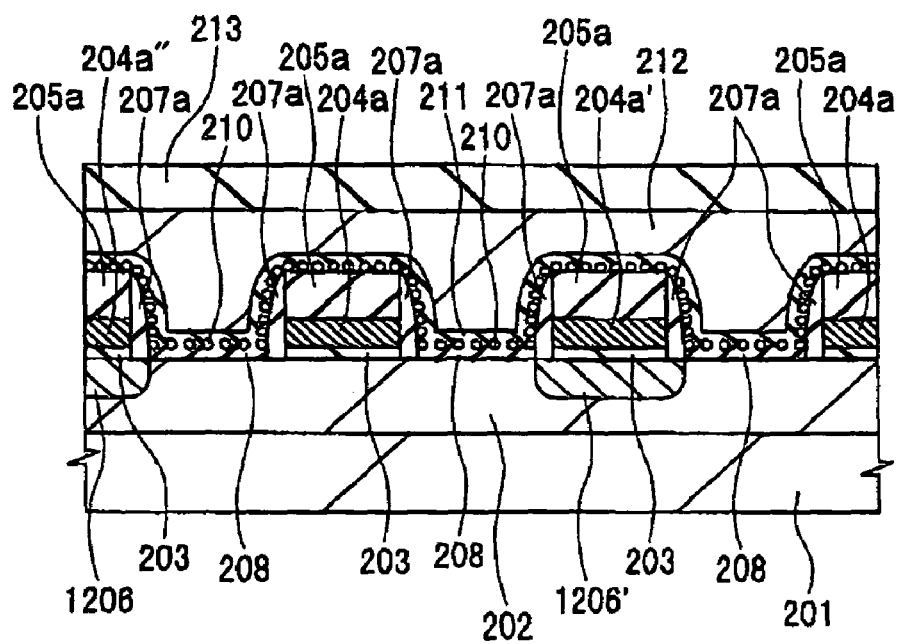
FIG. 72 is a cross-sectional view for describing a method of manufacturing the nonvolatile semiconductor memory device in the fourth embodiment of this invention.

Thereafter, the polysilicon-tungsten silicide stacked film or so-called polycide film 212 serving as the control gate and the silicon oxide film 213 are deposited and patterned by well-known lithographic and dry etching techniques, thereby forming the word line (FIG. 72).

Although not shown in the drawings, after the interpoly dielectric film is deposited, contact holes leading to the word line 212, the assist gates 204a and 204a', the source/drain diffusion layers 1206 and 1206', and the p-type well 202 are formed in this interpoly dielectric film. The metal film is then deposited and patterned to form a metal wire. The memory cell of the nonvolatile semiconductor memory device is thus completed.

Similarly to the first and second embodiment, the charge holding characteristic of the memory cell in this embodiment is improved as compared with a case where silicon nitride into which charges are injected is formed as the continuous film.

In addition, even in the case where the space between the assist gates is narrowed and the length of the channel formed by the silicon nitride dots is shortened, it is possible to discriminate states of the charges injected into the portions A and B shown in FIGS. 58 to 61, i.e., to store data of two bits after leaving the memory cell for a long period of time.

As described above, according to the fourth embodiment, it is advantageously possible to improve the reliability of the nonvolatile semiconductor memory device. It is also advantageously possible to reduce an memory cell area.

Fifth Embodiment

In the fifth embodiment, a result of applying this invention to a split gate type memory cell will be described with reference to FIGS. 73 to 84.

Figure 84:
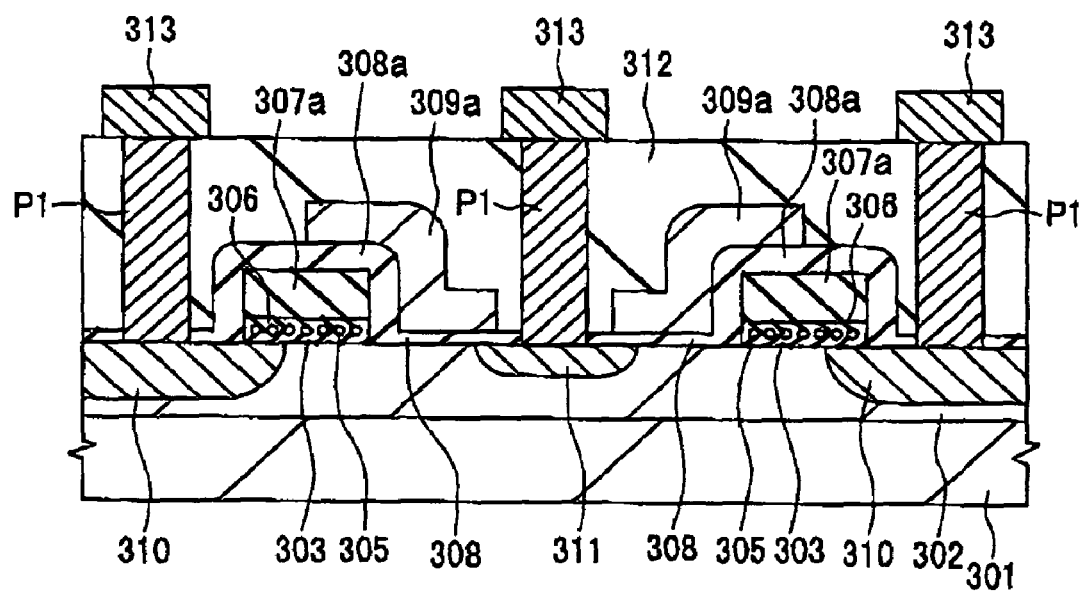
FIG. 84 is a cross-sectional view for describing a method of manufacturing the nonvolatile semiconductor memory device in the fifth embodiment of this invention.
Figure 85:
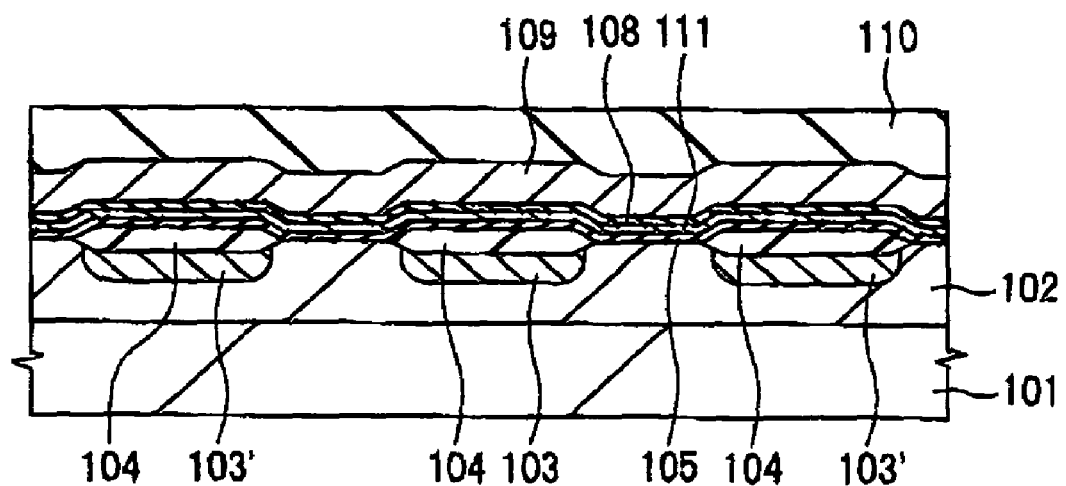
FIG. 85 is a cross-sectional view which illustrates the important parts of the nonvolatile semiconductor memory device for describing the advantages of the embodiments of this invention.
Figure 86:
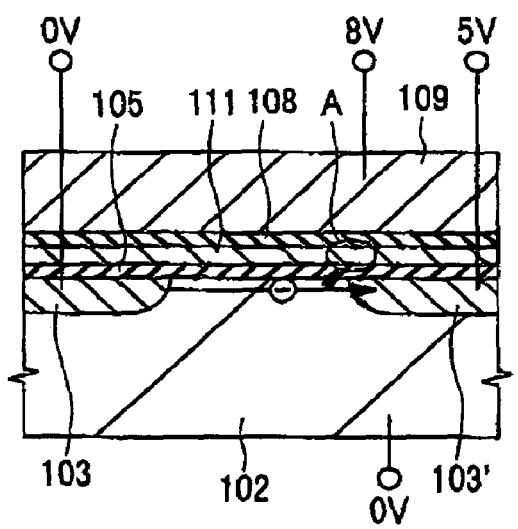
FIG. 86 is a cross-sectional view for describing the operations of the embodiments of this invention.
Figure 87:
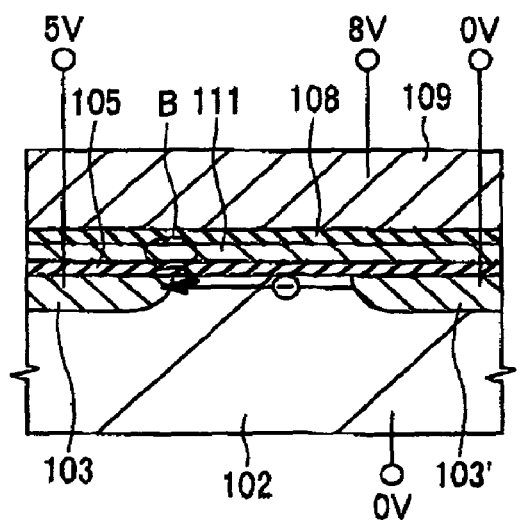
FIG. 87 is a cross-sectional view for describing the operations of the embodiments of this invention.
Figure 88:
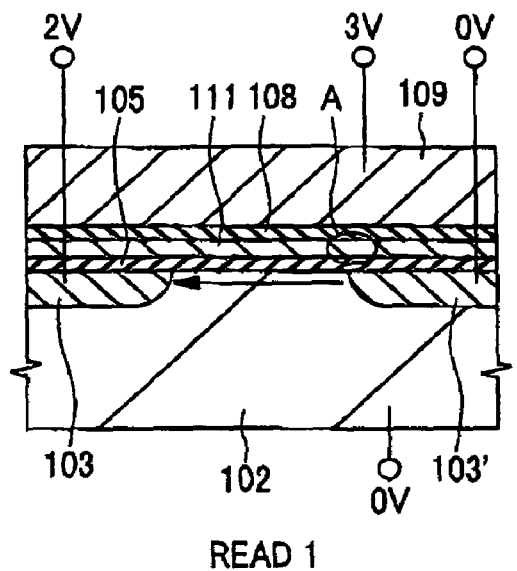
FIG. 88 is a cross-sectional view for describing the operations of the embodiments of this invention.
Figure 89:
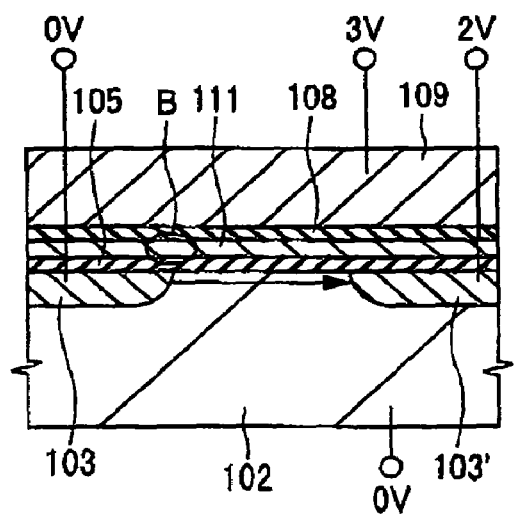
FIG. 89 is a cross-sectional view for describing the operations of the embodiments of this invention.

As shown in FIG. 84, the memory cell in this embodiment consists of second conductive type source/drain diffusion layers 301 and 301' in a p-type (first conductive type) well 302 formed in a silicon substrate 301, silicon nitride dots 305 into which charges are injected, a memory gate 307a serving as a first gate, and a control gate 309a serving as a second gate.

A silicon oxide film 303 serving as a first insulator film isolates the silicon nitride dots 305 from the p-type well 302. A silicon oxide film 306 serving as a second insulator film isolates the silicon nitride dots 305 from the memory gate 307a.

A part of the control gate 309a overlaps a channel section on the silicon substrate and the remainder thereof overlaps the memory gate 307a while being mounting up above the channel section and the memory gate 307a, respectively. The source 311 overlaps the control gate 309a whereas the drain 310 overlaps the silicon nitride dots 305.

As can be seen, the memory cell in this embodiment is a so-called split gate type memory cell in which a transistor controlled by the control gate 309a and a transistor controlled by the silicon nitride dots 305 are connected in series.

In a programming operation, a voltage of about 2V is biased to the control gate 309a, a voltage of about 8V is biased to the memory gate 307a, a voltage of 6V is biased to the drain 310, and the p-type well 302 and the source 311 are kept at 0V. By doing so, hot electrons are generated in the channel under the source-side silicon nitride dots 305 and the electrons are injected into the silicon nitride dots 305.

In an erase operation, for example, a positive voltage is biased to the drain 310, a negative voltage is biased to the memory gate 307a, voltages of the p-type well 302 and the source 311 are set at 0V, and holes generated on end portions of the drain are injected into the silicon nitride dots 305.

In the fifth embodiment, differently from the memory cell using the ONO film, the silicon nitride into which charges are injected is formed into the dot film instead of the continuous film, whereby it is possible to suppress the charge retention degradation of the memory cell caused by the movement of the charges in the channel direction.

In the memory cell including the split type gates, in particular, even in the case where data of one bit is programmed to the memory cell, the read operation is performed on the premise that electrons are locally injected and the injected electrons are present in these portions. It is, therefore, necessary to effectively prevent the movement of the injected electrons.

A method of manufacturing the memory cell in this embodiment will next be described with reference to FIGS. 73 to 84.

Figure 73:
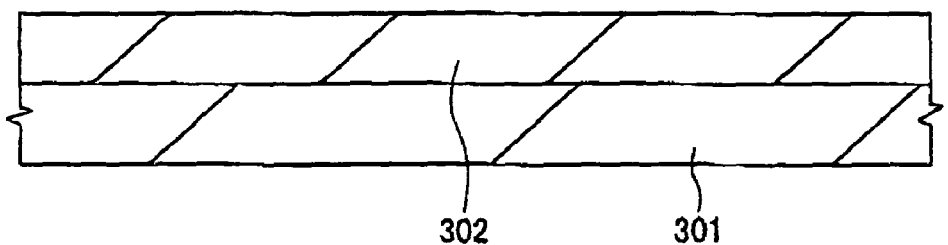
FIG. 73 is a cross-sectional view for describing a method of manufacturing the nonvolatile semiconductor memory device in the fifth embodiment of this invention.
Figure 74:
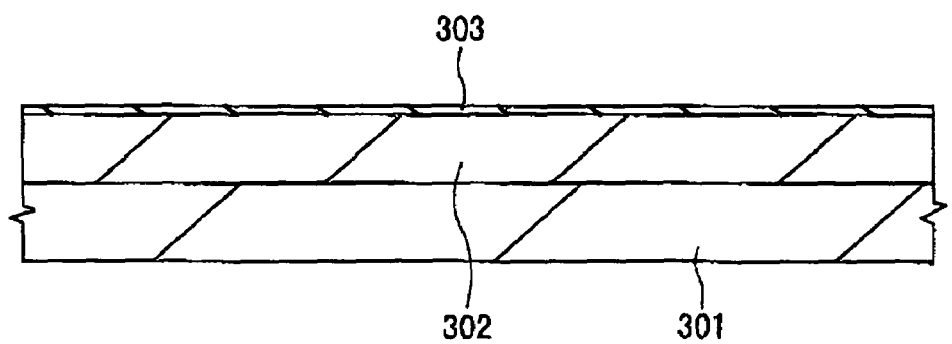
FIG. 74 is a cross-sectional view for describing a method of manufacturing the nonvolatile semiconductor memory device in the fifth embodiment of this invention.

First, the p-type well 302 is formed on the silicon substrate 301 (FIG. 73). The gate oxide film 303 that isolates the silicon nitride dots from the well is formed by the well-known thermal oxidation method (FIG. 74).

Figure 75:
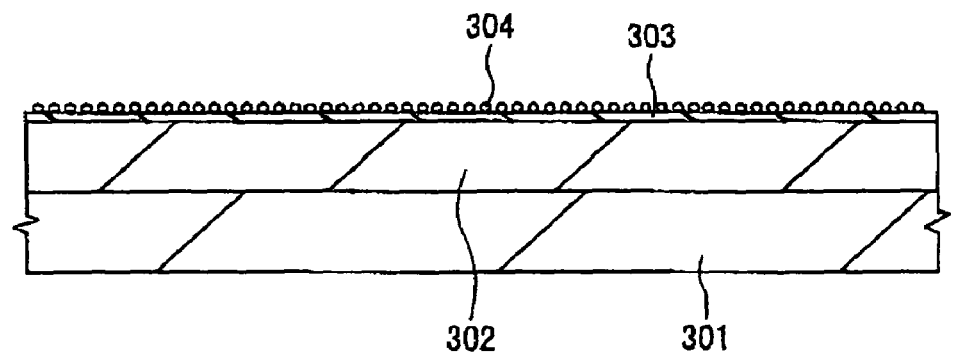
FIG. 75 is a cross-sectional view for describing a method of manufacturing the nonvolatile semiconductor memory device in the fifth embodiment of this invention.
Figure 76:
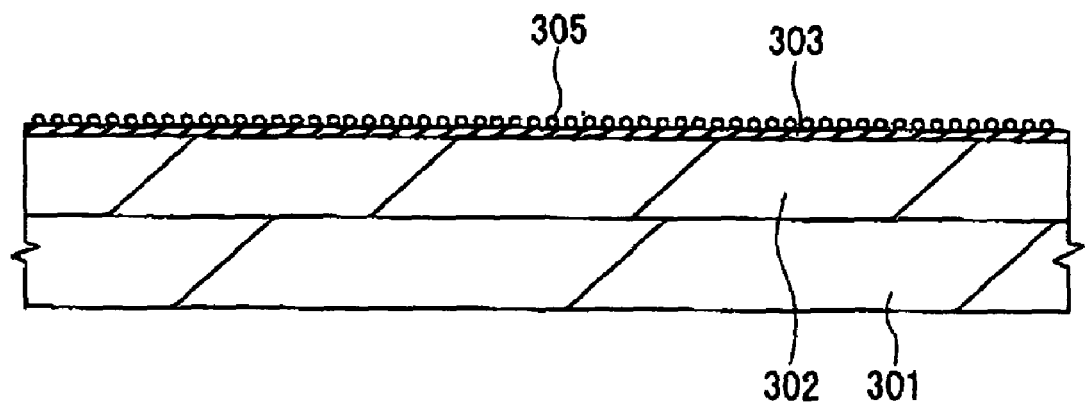
FIG. 76 is a cross-sectional view for describing a method of manufacturing the nonvolatile semiconductor memory device in the fifth embodiment of this invention.
Figure 77:
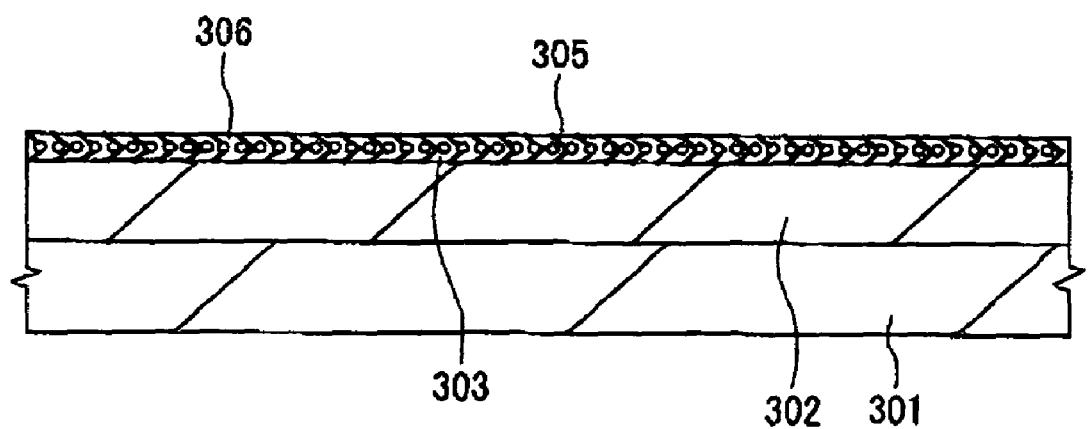
FIG. 77 is a cross-sectional view for describing a method of manufacturing the nonvolatile semiconductor memory device in the fifth embodiment of this invention.

Silicon nano-dots 304 are formed by the LPCVD method (FIG. 75). The silicon nano-dots 304 are subjected to plasma nitriding to thereby provide the silicon nitride dots 305 (FIG. 76). Thereafter, the silicon oxide film 306 that isolates the silicon nitride dots from the control gate is formed by, for example, the CVD method (FIG. 77).

Figure 78:
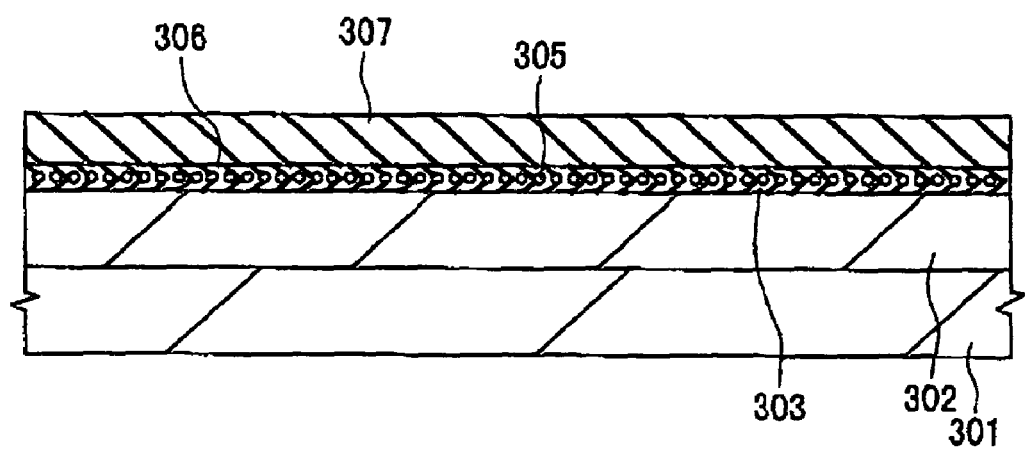
FIG. 78 is a cross-sectional view for describing a method of manufacturing the nonvolatile semiconductor memory device in the fifth embodiment of this invention.
Figure 79:
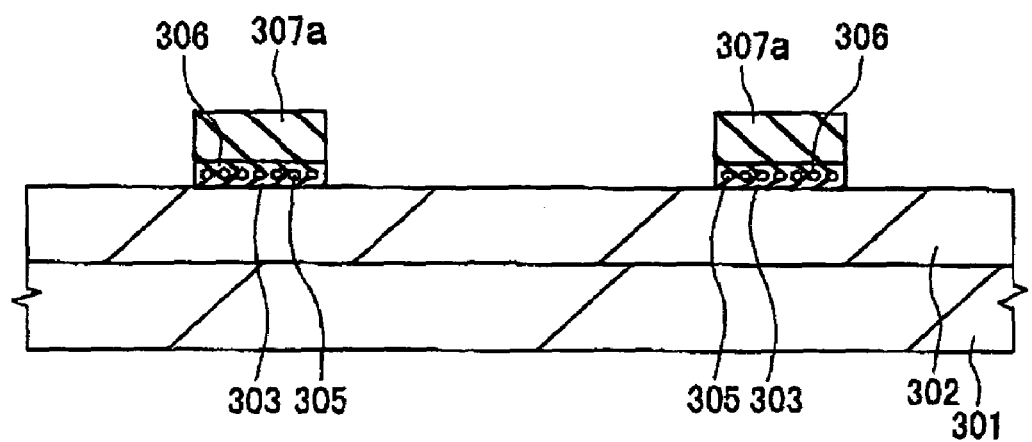
FIG. 79 is a cross-sectional view for describing a method of manufacturing the nonvolatile semiconductor memory device in the fifth embodiment of this invention.

A polysilicon film 307 doped with impurities such as phosphorus and serving as the memory gate is deposited (FIG. 78). Using the well-known lithographic and dry etching techniques, the polysilicon film 307 is patterned. As a result, the polysilicon film 307 is formed into the polysilicon film 307a (FIG. 79).

Figure 80:
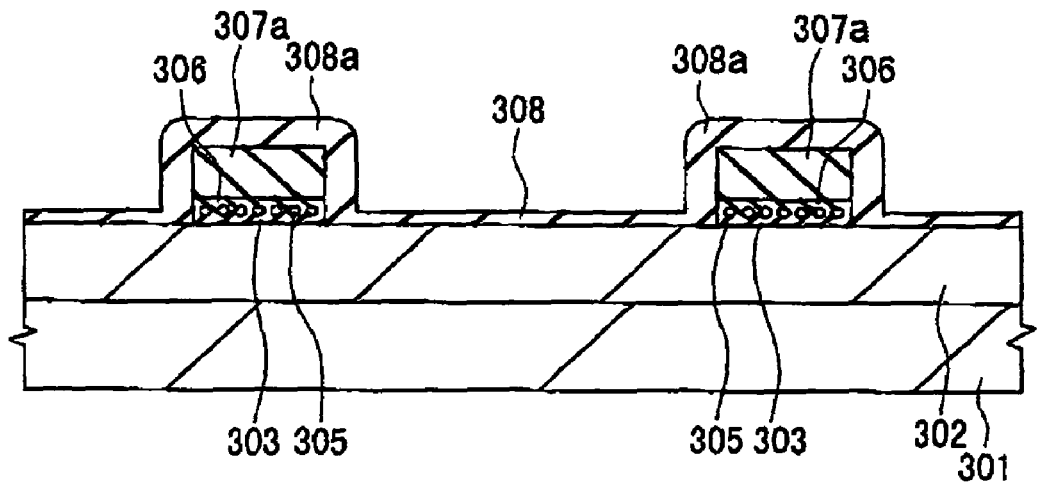
FIG. 80 is a cross-sectional view for describing a method of manufacturing the nonvolatile semiconductor memory device in the fifth embodiment of this invention.

A silicon oxide film 308 that isolates the memory gate from the substrate is formed by the well-known thermal oxidation method. At this time, thermal oxide films 308a thicker than the substrate are formed on sidewalls and an upper portion of the memory gate 307a, thereby making it possible to isolate the memory gate from the control gate (FIG. 80).

Figure 81:
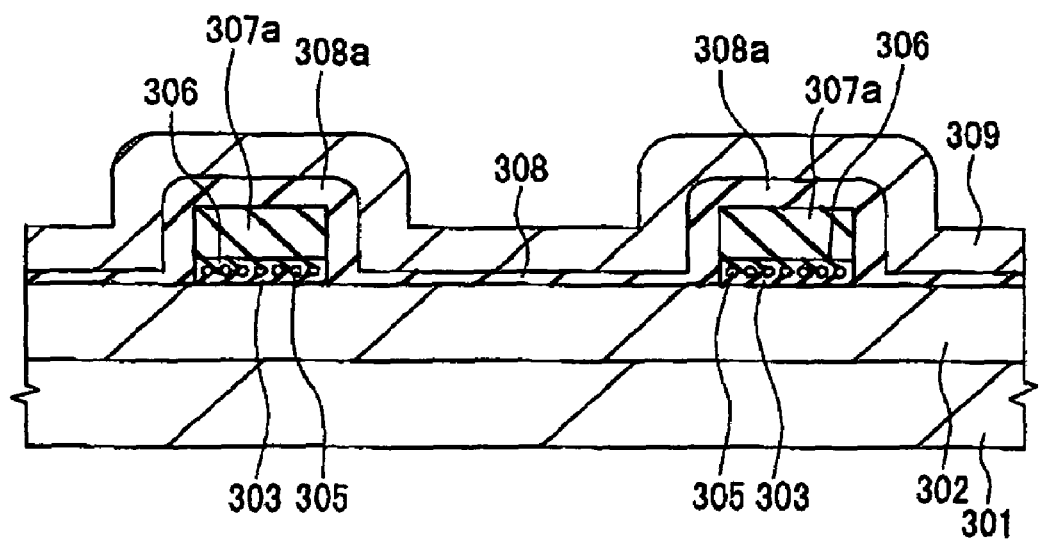
FIG. 81 is a cross-sectional view for describing a method of manufacturing the nonvolatile semiconductor memory device in the fifth embodiment of this invention.
Figure 82:
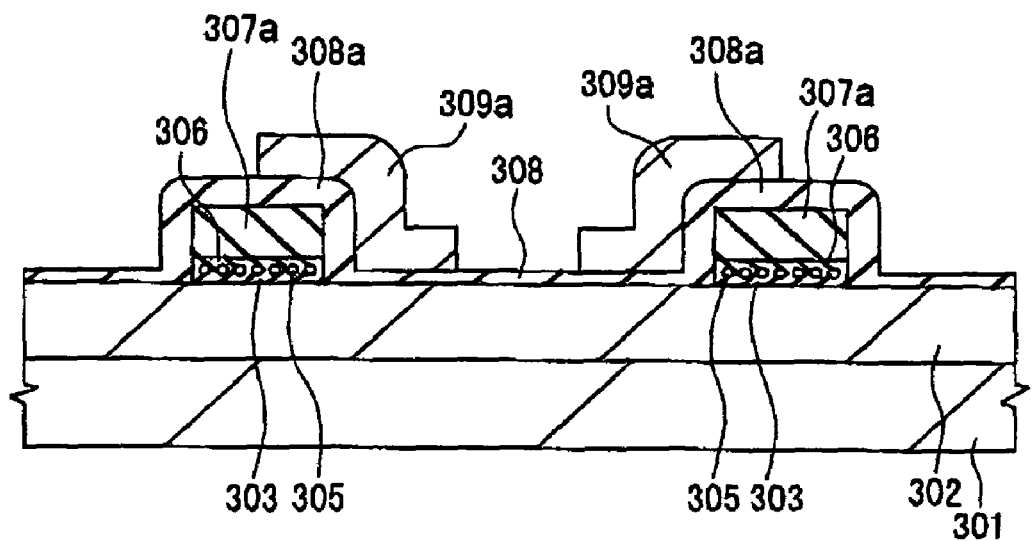
FIG. 82 is a cross-sectional view for describing a method of manufacturing the nonvolatile semiconductor memory device in the fifth embodiment of this invention.

Thereafter, a stacked film of a polysilicon film doped with impurities such as phosphorus and serving as the control gate and a tungsten silicide film, or so-called polycide film 309 is deposited (FIG. 81). The polycide film 309 is patterned by the well-known lithographic and dry etching techniques. Thus, the polycide film 309 is formed into the film 309a (FIG. 82).

Figure 83:
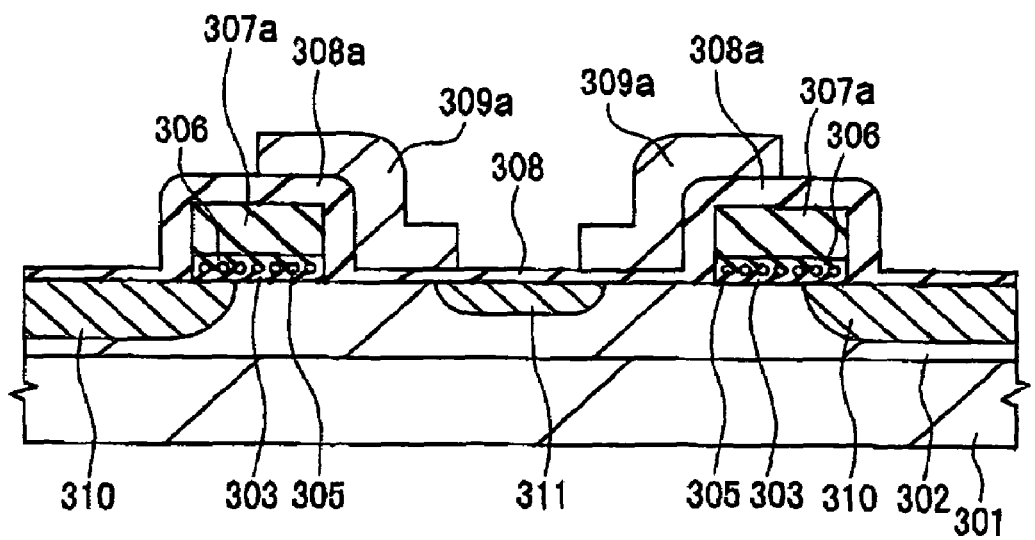
FIG. 83 is a cross-sectional view for describing a method of manufacturing the nonvolatile semiconductor memory device in the fifth embodiment of this invention.

The drain region 310 and the source region 311 of the memory cell are formed by the ion implantation method (FIG. 83). After forming an interpoly dielectric film 312, contact holes leading to the control gate 309a, the memory gate 307a, the source region 311, the drain region 310, and the p-type well 302 are formed in this interpoly dielectric film 312 and a metal film is then deposited and patterned to thereby form plugs P1 and wires 313, thus completing the memory cell (FIG. 84).

Similarly to the first and second embodiments, the charge holding characteristic of the memory cell in this embodiment is improved as compared with a case where silicon nitride into which charges are injected is formed as the continuous film.

According to the fifth embodiment, it is advantageously possible to improve the reliability of the nonvolatile semiconductor memory device.

In the first to fifth embodiments, it is also possible to realize so-called multilevel storage by setting the quantity of electrons injected into the silicon nitride dots to have, for example, four states. In this case, in the first, third, and fourth embodiments, data of four bits can be stored in one memory cell by a combination of two storage portions and the multilevel storage.

Further, in the first to fifth embodiments, the single layer silicon nitride dots are formed on the two insulator films. Alternatively, dot films may be stacked by further forming silicon nitride dots on the upper insulating film and depositing an insulator film on the silicon nitride dots. By repeating the formation of the insulator films and the dot films, many dots (charge injected portions) are provided and a charge storage capacity increases, accordingly.

The invention made by the inventor of this application has been described concretely based on the embodiments of the invention. Needless to say, this invention is not limited to these embodiments but various changes and modifications can be made thereto within the scope of the invention.

For example, this invention may be applied to a one-chip microcomputer (semiconductor device) including a memory cell array section that has nonvolatile semiconductor memory elements.

The advantages attained by the typical invention among those disclosed in this application will be briefly described as follows.

The reliability of the nonvolatile semiconductor memory device can be improved.

The memory cell size of the nonvolatile semiconductor memory device can be reduced.

What is claimed is:

1. A nonvolatile semiconductor memory device comprising:
   (a) a first insulator film formed above a semiconductor substrate;
   (b) silicon nitride dots formed on said first insulator film;
   (c) a second insulator film formed on said silicon nitride dots;
   (d) a conductive film formed on said second insulator film;
   (e) first and second semiconductor regions formed in said semiconductor substrate;
   (f) a channel region located between said first and second semiconductor regions, wherein
   (g) programming is performed by injecting charges from said channel region into said silicon nitride dots on a first end portion of said channel region on a side of said first semiconductor region or into said silicon nitride dots on a second end portion of said channel region on a side of said second semiconductor region, and wherein
   (h) said and second insulator films are silicon oxide films, and wherein
   (i) surface portions of said silicon nitride dots are higher in nitrogen concentration than central portions of said silicon nitride dots.

2. The nonvolatile semiconductor memory device according to claim 1, wherein
   said first and second semiconductor regions extend in a first direction, and
   said conductive film extends in a second direction orthogonal to said first direction.

3. The nonvolatile semiconductor memory device according to claim 1, wherein
   said silicon nitride dots are $Si_xN_{1-x}$ and the X is approximately 0.43.

4. The nonvolatile semiconductor memory device according to claim 1, wherein
   said silicon nitride dots are present as a single layer on said first insulator film.

5. A nonvolatile semiconductor memory device comprising:
   (a) first and second semiconductor regions formed in a semiconductor substrate;
   (b) a channel region located between said first and second semiconductor regions;
   (c) a first silicon oxide film formed above said semiconductor substrate, and extending from above said channel region toward above said first semiconductor region;
   (d) silicon nitride dots formed on said first silicon oxide film;
   (e) a second silicon oxide film formed on said silicon nitride dots;
   (f) a first conductive film formed on said second silicon oxide film;
   (g) an insulator film formed above said semiconductor substrate, and extending from above said channel region toward above said second semiconductor region; and
   (h) a second conductive film formed on said insulator film, wherein
   (i) programming is performed by injecting charges from said channel region into said silicon nitride dots on an end portion of said channel region on a side of said second semiconductor region,
   (j) said first and second silicon oxide films are larger in barrier height than silicon nitride, and wherein (k) surface portions of said silicon nitride dots are higher in nitrogen concentration than central portions of said silicon nitride dots.

6. The nonvolatile semiconductor memory device according to claim 5, wherein
said first and second semiconductor regions extend in a first direction,
said first conductive film extends in a second direction orthogonal to said first direction, and
said second conductive film extends in said first direction.

7. The nonvolatile semiconductor memory device according to claim 5, wherein
said first silicon oxide film is a thermal oxide film, and said second silicon oxide film is a deposited film.

8. The nonvolatile semiconductor memory device according to claim 5, wherein
said silicon nitride dots are $Si_xN_{1-x}$ and the X is approximately 0.43.

9. The nonvolatile semiconductor memory device according to claim 5, wherein
said silicon nitride dots are present as a single layer on said first silicon oxide film.

10. A nonvolatile semiconductor memory device comprising:
(a) first and second semiconductor regions formed in a semiconductor substrate;
(b) a channel region located between said first and second semiconductor regions;
(c) a first insulator film formed above said semiconductor substrate, and extending from above said channel region toward above said first semiconductor region;
(d) a first conductive film formed on said first insulator film;
(e) a second insulator film formed above said semiconductor substrate, and extending from above said channel region toward above said second semiconductor region;
(f) a second conductive film formed on said second insulator film;
(g) a third insulator film formed above said semiconductor substrate between said first and second conductive films;
(h) silicon nitride dots formed on said third insulator film;
(i) a fourth insulator film formed on said silicon nitride dots; and
(j) a third conductive film formed on said silicon nitride dots, wherein
(k) programming is performed by injecting charges from said channel region into said silicon nitride dots on a first end portion on a side of said first conductive film or into said silicon nitride dots on a second end portion on a side of said second conductive film, and wherein
(l) said third and fourth insulator films are silicon oxide films, and wherein
(m) surface portions of said silicon nitride dots are higher in nitrogen concentration than central portions of said silicon nitride dots.

11. The nonvolatile semiconductor memory device according to claim 10, wherein
said first and second semiconductor regions extend in a first direction,
said first and second conductive films extend in said first direction, and
said third conductive film extends in a second direction orthogonal to said first direction.

12. The nonvolatile semiconductor memory device according to claim 10, wherein
said silicon nitride dots are $Si_xN_{1-x}$ and the X is approximately 0.43.

13. The nonvolatile semiconductor memory device according to claim 10, wherein
said silicon nitride dots are present as a single layer on said third insulator film.

14. A nonvolatile semiconductor memory device comprising:
(a) first and second semiconductor regions formed in a semiconductor substrate;
(b) a channel region located between said first and second semiconductor regions;
(c) a first insulator film formed above said semiconductor substrate on said channel region;
(d) a first conductive film formed on said first insulator film;
(e) a second insulator film formed above said semiconductor substrate on both sides of said first conductive film;
(f) silicon nitride dots formed on said second insulator film;
(g) a third insulator film formed on said silicon nitride dots; and
(h) a second conductive film formed on said third insulator film, wherein
(i) programming is performed by injecting charges into said silicon nitride dots adjacent to the both sides of said first conductive film, respectively, and wherein
said second and third insulator films are silicon oxide films, and wherein
surface portions of said silicon nitride dots are higher in nitrogen concentration than central portions of said silicon nitride dots.

15. The nonvolatile semiconductor memory device according to claim 14, wherein
said silicon nitride dots are $Si_xN_{1-x}$ and the X is approximately 0.43.

16. The nonvolatile semiconductor memory device according to claim 14, wherein
said silicon nitride dots are present as a single layer on said first insulator film.

17. A nonvolatile semiconductor memory device comprising:
(a) a first insulator film formed above a semiconductor substrate;
(b) silicon nitride dots formed on said first insulator film;
(c) a second insulator film formed on said silicon nitride dots;
(d) a conductive film formed on said second insulator film;
(e) first and second semiconductor regions formed in said semiconductor substrate; and
(f) a channel region located between said first and second semiconductor regions,
wherein programming is performed by injecting charges from said channel region into said silicon nitride dots on a first end portion of said channel region on a side of said first semiconductor region or into said silicon nitride dots on a second end portion of said channel region on a side of said second semiconductor region,
said first and second insulator films are silicon oxide films,
injection of said charges into said silicon nitride dots on said first end portion is conducted by carrying electrons from said second semiconductor region toward said first semiconductor region,
injection of said charges into said silicon nitride dots on said second end portion is conducted by carrying electrons from said first semiconductor region toward said second semiconductor region, said charges injected into said silicon nitride dots on said first end portion are determined by carrying the electrons from said first semiconductor region to said second semiconductor region, said charges injected into said silicon nitride dots on said second end portion are determined by carrying the electrons from said second semiconductor region to said first semiconductor region, and surface portions of said silicon nitride dots are higher in nitrogen concentration than central portions of said silicon nitride dots.

18. A nonvolatile semiconductor memory device comprising:
(a) first and second semiconductor regions formed in a semiconductor substrate;
(b) a channel region located between said first and second semiconductor regions;
(c) a first silicon oxide film formed above said semiconductor substrate, and extending from above said channel region toward above said first semiconductor region;
(d) silicon nitride dots formed on said first silicon oxide film;
(e) a second silicon oxide film formed on said silicon nitride dots;
(f) a first conductive film formed on said second silicon oxide film;
(g) an insulator film formed above said semiconductor substrate, and extending from above said channel region toward above said second semiconductor region;
(h) a second conductive film formed on said insulator film,
wherein programming is performed by injecting charges from said channel region into said silicon nitride dots on an end portion of said channel region on a side of said second semiconductor region,
said first and second silicon oxide films are larger in barrier height than silicon nitride,
injection of said charges into said silicon nitride dots is conducted by carrying electrons from said second semiconductor region toward said first semiconductor region,
said charges injected into said silicon nitride dots are determined by carrying the electrons from said first semiconductor region to said second semiconductor region, and
surface portions of said silicon nitride dots are higher in nitrogen concentration than central portions of said silicon nitride dots.

19. A nonvolatile semiconductor memory device comprising:
(a) first and second semiconductor regions formed in a semiconductor substrate;
(b) a channel region located between said first and second semiconductor regions;
(c) a first silicon oxide film formed above said semiconductor substrate, and extending from above said channel region toward above said first semiconductor region;
(d) silicon nitride dots formed on said first silicon oxide film;
(e) a second silicon oxide film formed on said silicon nitride dots;
(f) a first conductive film formed on said second silicon oxide film;
(g) an insulator film formed above said semiconductor substrate, and extending from above said channel region toward above said second semiconductor region; and
(h) a second conductive film formed on said insulator film,
wherein programming is performed by injecting charges from said channel region into said silicon nitride dots on an end portion of said channel region on a side of said second semiconductor region,
said first and second silicon oxide films are larger in barrier height than silicon nitride,
said first and second semiconductor regions and said first and second conductive films extend in a same direction,
said second conductive film extends to be mounting up above said first conductive film, and
surface portions of said silicon nitride dots are higher in nitrogen concentration than central portions of said silicon nitride dots.

20. A nonvolatile semiconductor memory device comprising:
(a) first and second semiconductor regions formed in a semiconductor substrate;
(b) a channel region located between said first and second semiconductor regions;
(c) a first insulator film formed above said semiconductor substrate, and extending from above said channel region toward above said first semiconductor region;
(d) a first conductive film formed on said first insulator film;
(e) a second insulator film formed above said semiconductor substrate, and extending from above said channel region toward above said second semiconductor region;
(f) a second conductive film formed on said second insulator film;
(g) a third insulator film formed above said semiconductor substrate between said first and second conductive films;
(h) silicon nitride dots formed on said third insulator film;
(i) a fourth insulator film formed on said silicon nitride dots; and
(j) a third conductive film formed on said fourth insulator film,
wherein programming is performed by injecting charges from said channel region into said silicon nitride dots on a first end portion on a side of said first conductive film or into said silicon nitride dots on a second end portion on a side of said second conductive film,
said third and fourth insulator films are silicon oxide films,
injection of said charges into said silicon nitride dots on said first end portion is conducted by carrying electrons from said first semiconductor region toward said second semiconductor region,
injection of said charges into said silicon nitride dots on said second end portion is conducted by carrying electrons from said second semiconductor region toward said first semiconductor region,
said charges injected into said silicon nitride dots on said first end portion are determined by carrying the electrons from said second semiconductor region to said first semiconductor region,
said charges injected into said silicon nitride dots on said second end portion are determined by carrying the electrons from said first semiconductor region to said second semiconductor region, and
surface portions of said silicon nitride dots are higher in nitrogen concentration than central portions of said silicon nitride dots.

* * * * *